US011394356B1

(12) United States Patent
Garcia

(10) Patent No.: US 11,394,356 B1
(45) Date of Patent: Jul. 19, 2022

(54) BLOCK-BASED AUDIO LIMITER

(71) Applicant: Amazon Technologies, Inc., Seattle, WA (US)

(72) Inventor: Guillermo Daniel Garcia, Berkeley, CA (US)

(73) Assignee: Amazon Technologies, Inc., Seattle, WA (US)

(*) Notice: Subject to any disclaimer, the term of this patent is extended or adjusted under 35 U.S.C. 154(b) by 0 days.

(21) Appl. No.: 17/174,663

(22) Filed: Feb. 12, 2021

(51) Int. Cl.
*H03G 3/30* (2006.01)
*G10L 25/51* (2013.01)
*H04R 3/00* (2006.01)
*H04R 29/00* (2006.01)
*G10L 21/034* (2013.01)

(52) U.S. Cl.
CPC ......... *H03G 3/3005* (2013.01); *G10L 21/034* (2013.01); *G10L 25/51* (2013.01); *H04R 3/00* (2013.01); *H04R 29/002* (2013.01); *H03G 2201/103* (2013.01)

(58) Field of Classification Search
CPC .. H03G 3/3005; H03G 2201/103; H04R 3/00; H04R 29/002; G10L 21/034; G10L 25/51
USPC .......................................... 381/104, 107, 109
See application file for complete search history.

(56) References Cited

U.S. PATENT DOCUMENTS

| 8,204,255 | B2* | 6/2012 | Grove | H04S 1/007 381/104 |
| 9,491,538 | B2* | 11/2016 | Nandury | H04R 3/00 |
| 9,509,267 | B2* | 11/2016 | Patwardhan | H03G 3/32 |
| 2014/0233761 | A1* | 8/2014 | Hu | H03G 3/32 381/107 |
| 2016/0197590 | A1* | 7/2016 | Koppens | G06F 3/165 381/106 |

* cited by examiner

*Primary Examiner* — Xu Mei
(74) *Attorney, Agent, or Firm* — Pierce Atwood LLP

(57) ABSTRACT

A system configured to perform audio limiting using block-based processing to reduce acoustic distortion and/or computational cost. While sample-by-sample processing would apply a plurality of gain ramps to a single audio sample, the block-based processing applies a single gain ramp to ensure that the audio sample is below a threshold value. To perform block-based processing, an audio limiter component identifies a maximum amplitude value across all channels for a selected audio frame of an audio signal. Using the maximum amplitude value and the threshold value, the audio limiter component determines a block gain value associated with the selected audio frame and selects between attack processing, hold processing, or release processing. Using the selected processing and the block gain value, the audio limiter component determines instantaneous gain values for the audio samples within the audio frame.

20 Claims, 14 Drawing Sheets

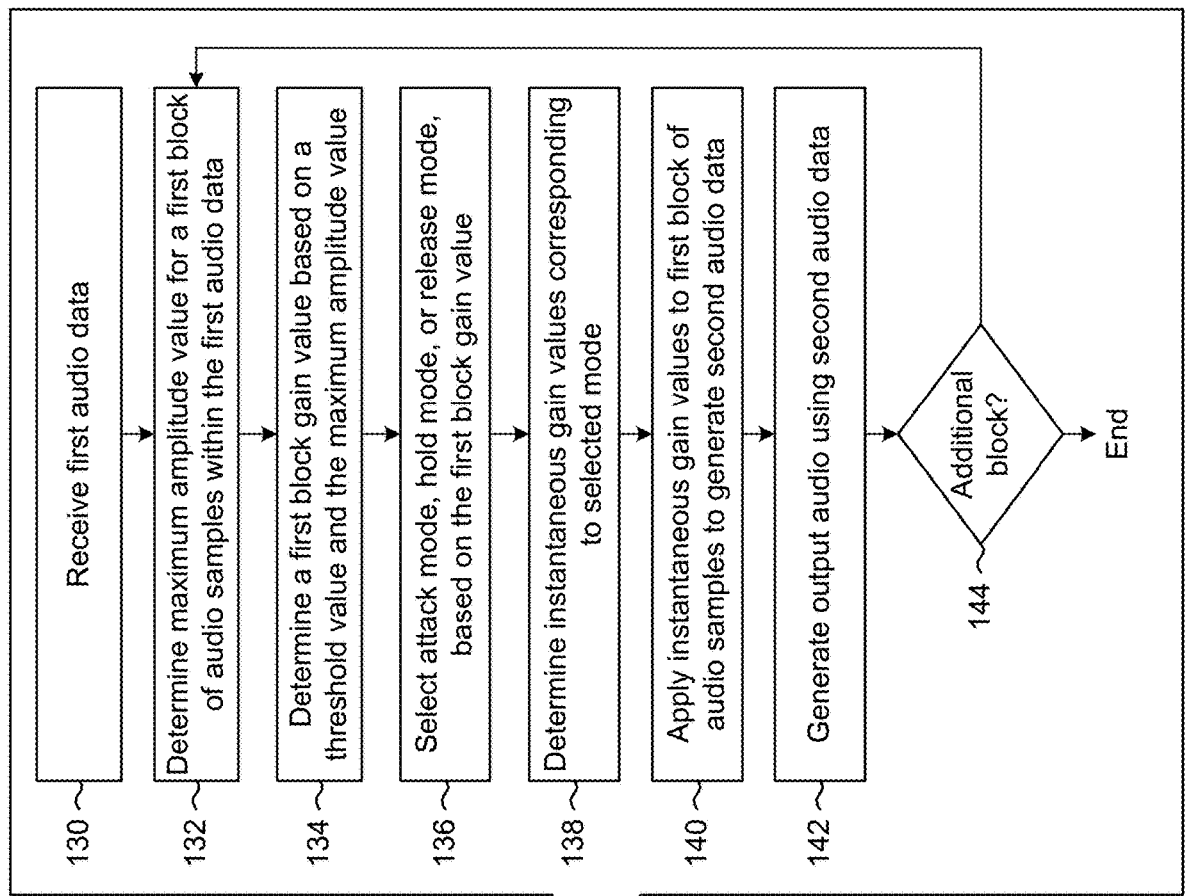
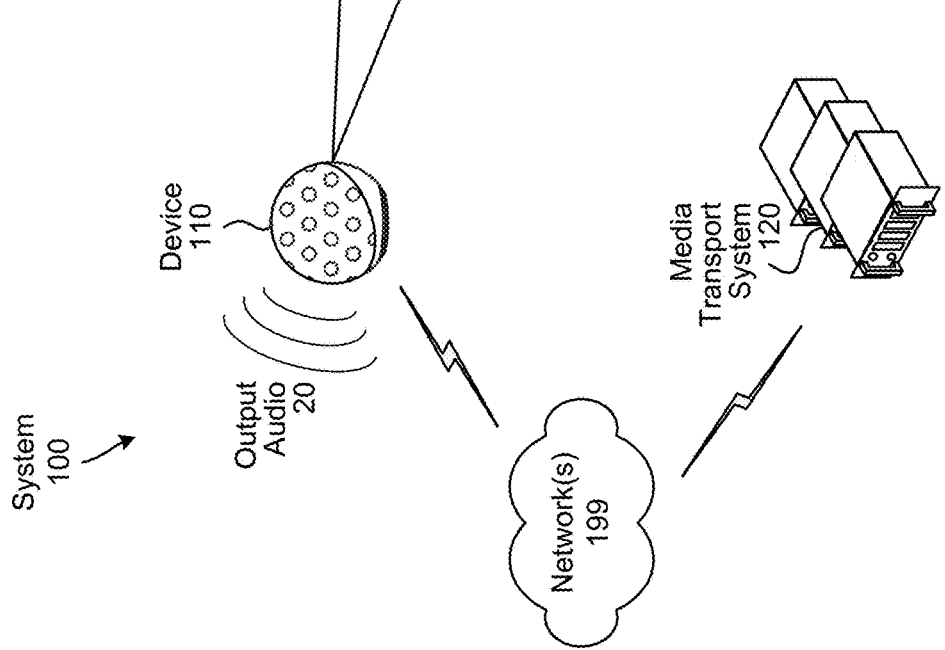

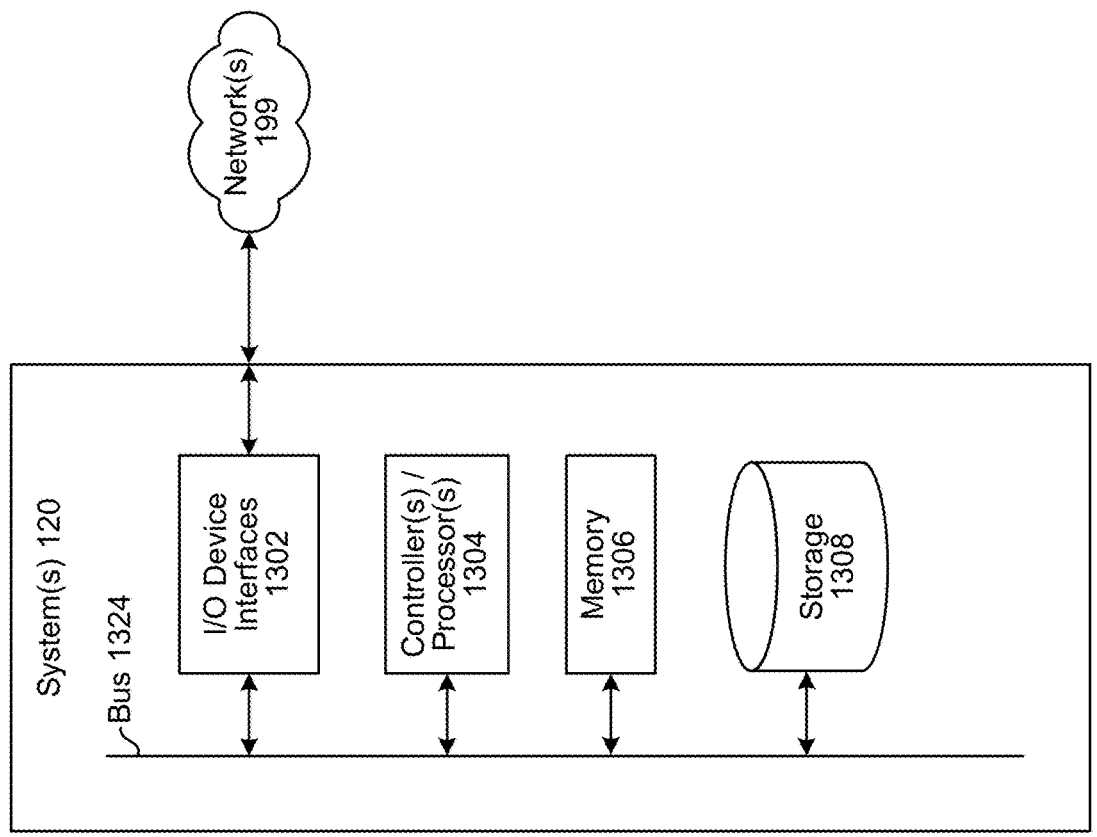

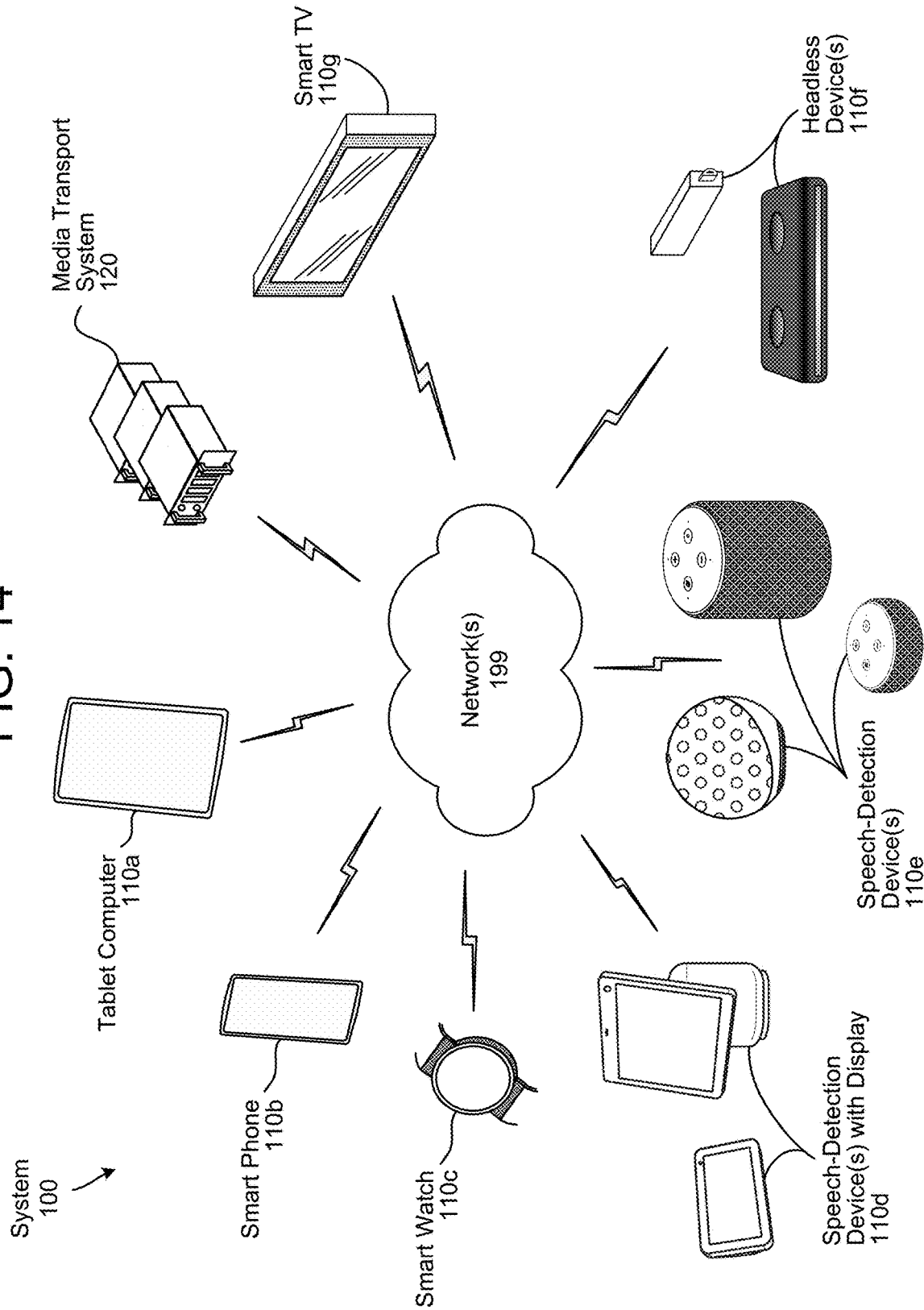

BLOCK-BASED AUDIO LIMITER

BACKGROUND

With the advancement of technology, the use and popularity of electronic devices has increased considerably. Electronic devices are commonly used to capture and process audio data.

BRIEF DESCRIPTION OF DRAWINGS

For a more complete understanding of the present disclosure, reference is now made to the following description taken in conjunction with the accompanying drawings.

FIG. 1 illustrates an example of performing block-based audio limiter processing according to embodiments of the present disclosure.

FIG. 13 is a block diagram conceptually illustrating example components of a remote device according to embodiments of the present disclosure.

FIG. 14 illustrates an example of a computer network for use with the overall system according to embodiments of the present disclosure.

DETAILED DESCRIPTION

Figure 2:
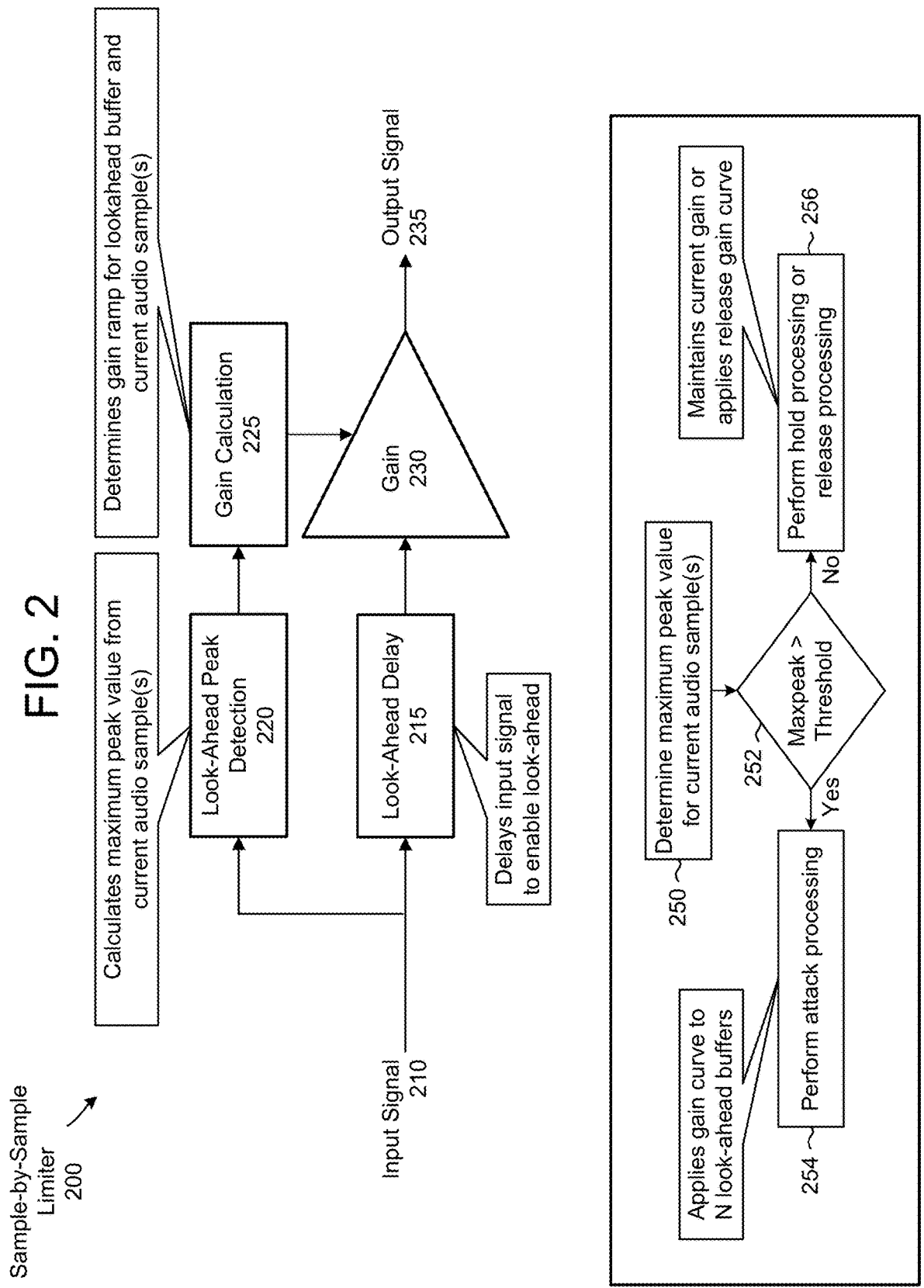
FIG. 2 illustrates an example component diagram of a sample-by-sample audio limiter.

Electronic devices may be used to capture and/or process audio data as well as output audio represented in the audio data. To prevent audio clipping from occurring when generating the output audio, the device may perform audio limiting to attenuate an audio signal that exceeds a threshold value. In conventional techniques, audio limiting is performed sample-by-sample, such that the device iteratively processes individual audio samples of the audio signal. To reduce acoustic distortion caused by discontinuities, however, the audio limiter applies attenuation to a fixed number of audio samples prior to a selected sample. This results in an increased processing consumption as an individual audio sample may be attenuated by multiple gain curves. In addition, the attenuated output signal may exhibit audible distortion caused by oscillations in the gain values.

To reduce a processing consumption (e.g., computational cost) and further reduce acoustic distortion, devices, systems and methods are disclosed that perform audio limiting using block-based processing. Whereas sample-by-sample processing would apply a plurality of gain curves to a single audio sample, the block-based processing applies a single gain curve to ensure that the audio sample is below a threshold value. To perform block-based processing, an audio limiter component identifies a maximum amplitude value across all channels for a selected audio frame of an audio signal. Using the maximum amplitude value and the threshold value, the audio limiter component determines a block gain value associated with the selected audio frame and selects between attack processing, hold processing, or release processing. Using the selected processing and the block gain value, the audio limiter component determines instantaneous gain values for the audio samples within the audio frame.

FIG. 1 illustrates a high-level conceptual block diagram of a system 100 configured to perform block-based audio limiter processing according to embodiments of the disclosure. Although FIG. 1 and other figures/discussion illustrate the operation of the system in a particular order, the steps described may be performed in a different order (as well as certain steps removed or added) without departing from the intent of the disclosure. As illustrated in FIG. 1, the system 100 may include a device 110 configured to output audio, and the device 110 may be communicatively coupled to a media transport system 120 via network(s) 199. For example, the device 110 may receive audio data from the media transport system 120, such as audio data corresponding to media content or a communication session, although the disclosure is not limited thereto.

As illustrated in FIG. 1, the device 110 may receive (130) first audio data, may determine (132) a maximum amplitude value for a first block of audio samples within the first audio data, and may determine (134) a first block gain value based on a threshold value and the maximum amplitude value. For example, the device 110 may process the first block of audio samples to determine a maximum amplitude value (e.g., maximum peak value) across all channels of the first block of audio samples. If the maximum amplitude value does not exceed a threshold value, the device 110 may set the first block gain value equal to a first value (e.g., value of 1.0 or 0 dB). In contrast, if the maximum amplitude value exceeds the threshold value, the device 110 may calculate the first block gain value in order to attenuate the maximum amplitude value and avoid audio clipping. For example, the device 110 may determine the first block gain value by dividing the threshold value by the maximum amplitude value, although the disclosure is not limited thereto.

The device 110 may select (136) an attack mode, a hold mode, or a release mode based on the first block gain value. For example, the device 110 may compare the first block gain value to a previous block gain value to determine whether to select the attack mode. If the first block gain value exceeds the previous block gain value, the device 110 may determine whether to select the hold mode based on a hold time, hold counter, and/or the like. Finally, if the device 110 determines not to select the attack mode or the hold mode, the device 110 may select the release mode.

Based on the selected processing mode and the first block gain value, the device 110 may determine (138) instantaneous gain values corresponding to the selected processed mode. For example, as described in greater detail below with regard to FIG. 3, the device 110 may generate gain curves to transition between subsequent block gain values. While not illustrated in FIG. 1, during release processing the device 110 may determine a target block gain value using a gain history buffer, gain minima tracking processing, and/or the like. Releasing to the target block gain value instead of to a fixed value (e.g., 0 dB) may improve processing and reduce distortion.

The device 110 may then apply (140) the instantaneous gain values to the first block of audio samples to generate second audio data and may generate (142) output audio using the second audio data. For example, the device 110 may attenuate the first block of audio samples based on the instantaneous gain values in order to avoid audio clipping in the output audio.

As the device 110 is generating the output audio, the device 110 may determine (144) whether there is an additional block of audio samples within the first audio data and, if there is, may loop to step 132 and repeat steps 132-142 for the additional block of audio samples. Thus, the device 110 may iteratively performs steps 132-142 for each individual block of audio samples until the device 110 has generated the output audio corresponding to an entirety of the first audio data. For example, if the device 110 determines in step 144 that there is not an additional block of audio samples, the device 110 may stop generating the output audio.

To illustrate an example of performing block-based audio limiting, the device 110 may separate the first audio data into blocks (e.g., audio frames) that are 8 ms long, although the disclosure is not limited thereto. For example, when the first audio data has a sampling rate of 48 kHz, the device 110 may process an individual audio frame that includes 384 audio samples, which collectively span the desired duration of time (e.g., 8 ms). However, the disclosure is not limited thereto, and the desired duration of time, the sampling rate, and/or the number of samples may vary without departing from the disclosure.

Instead of applying a plurality of gain curves to an individual audio sample (e.g., up to 96 separate multiplication operations for a single audio sample), the device 110 may process an entire block of audio samples (e.g., 384 audio samples) and apply a single gain curve for each block transition (e.g., transition between adjacent audio frames). To illustrate a first example, when a selected block of audio samples triggers attack processing, the device 110 may apply a first gain curve (e.g., gain ramp that gradually attenuates the input signal) to audio samples included in a look-ahead period prior to the selected block of audio samples (e.g., portion of the previous block of audio samples). Thus, the first gain curve is applied during the look-ahead period and the new gain value is applied to the selected block of audio samples. To illustrate a second example, when a selected block of audio samples triggers release processing, the device 110 may apply a second gain curve (e.g., gain curve that gradually increases the input signal) to audio samples included in the look-ahead period and to the selected block of audio samples (e.g., both the portion of the previous block of audio samples and the selected block of audio samples).

An audio signal is a representation of sound and an electronic representation of an audio signal may be referred to as audio data, which may be analog and/or digital without departing from the disclosure. For ease of illustration, the disclosure may refer to either audio data (e.g., microphone audio data, input audio data, etc.) or audio signals (e.g., microphone signal, input audio signal, etc.) without departing from the disclosure. Additionally or alternatively, portions of a signal may be referenced as a portion of the signal or as a separate signal and/or portions of audio data may be referenced as a portion of the audio data or as separate audio data. For example, a first audio signal may correspond to a first period of time (e.g., 30 seconds) and a portion of the first audio signal corresponding to a second period of time (e.g., 1 second) may be referred to as a first portion of the first audio signal or as a second audio signal without departing from the disclosure. Similarly, first audio data may correspond to the first period of time (e.g., 30 seconds) and a portion of the first audio data corresponding to the second period of time (e.g., 1 second) may be referred to as a first portion of the first audio data or second audio data without departing from the disclosure. Audio signals and audio data may be used interchangeably, as well; a first audio signal may correspond to the first period of time (e.g., 30 seconds) and a portion of the first audio signal corresponding to a second period of time (e.g., 1 second) may be referred to as first audio data without departing from the disclosure.

In some examples, the audio data may correspond to audio signals in a time-domain. However, the disclosure is not limited thereto and the device 110 may convert these signals to a subband-domain or a frequency-domain prior to performing additional processing, such as adaptive feedback reduction (AFR) processing, acoustic echo cancellation (AEC), noise reduction (NR) processing, and/or the like. For example, the device 110 may convert the time-domain signal to the subband-domain by applying a bandpass filter or other filtering to select a portion of the time-domain signal within a desired frequency range. Additionally or alternatively, the device 110 may convert the time-domain signal to the frequency-domain using a Fast Fourier Transform (FFT) and/or the like.

As used herein, audio signals or audio data (e.g., microphone audio data, or the like) may correspond to a specific range of frequency bands. For example, the audio data may correspond to a human hearing range (e.g., 20 Hz-20 kHz), although the disclosure is not limited thereto.

As used herein, a frequency band (e.g., frequency bin) corresponds to a frequency range having a starting frequency and an ending frequency. Thus, the total frequency range may be divided into a fixed number (e.g., 256, 512, etc.) of frequency ranges, with each frequency range referred to as a frequency band and corresponding to a uniform size. However, the disclosure is not limited thereto and the size of the frequency band may vary without departing from the disclosure.

As used herein, a time-domain signal may be represented as a sequence of individual audio samples of audio data. For example, a time-domain signal may be represented based on an individual audio sample s (e.g., x(s) denotes an individual audio sample s) or a time t (e.g., x(t) denotes an individual sample that is associated with the time t). While the time-domain signal x(s) is comprised of a plurality of audio samples, in some examples the device 110 may group a plurality of audio samples and process them together. For example, the device 110 may group the plurality of audio samples together in an audio frame (e.g., input frame, output frame, and/or the like). Thus, the time-domain signal may be represented based on an individual audio frame n, such that x(n) denotes an individual audio frame (e.g., fixed number of samples s) associated with a frame index n.

FIG. 2 illustrates an example component diagram of a sample-by-sample audio limiter. As described above, a sample-by-sample limiter 200 may perform gain calculations iteratively on individual audio samples. As illustrated in FIG. 2, the sample-by-sample limiter 200 may receive an input signal 210 (e.g., input audio data) and may process current audio sample(s) of the input signal 210 using a look-ahead peak detection component 220 to determine a maximum peak value of the input signal 210. For example, when the input signal 210 includes a single channel (e.g., mono input comprising a single audio channel), the look-ahead peak detection component 220 may determine the maximum peak value based on a current peak value of a single audio sample. Alternatively, when the input signal 210 includes two channels (e.g., stereo input comprising two audio channels), the look-ahead peak detection component 220 may determine a maximum peak value based on two current audio samples (e.g., maximum of a left peak value or a right peak value). Thus, the look-ahead peak detection component 220 processes the input signal 210 one audio sample or pair of audio samples at a time.

Based on the maximum peak value (e.g., current peak value for mono input or maximum peak value for stereo input), a gain calculation component 225 may determine a current gain value associated with the current audio sample(s). For example, the gain calculation component 225 may compare the maximum peak value to a threshold value and, if the maximum peak value exceeds the threshold value, may determine a current gain value based on the maximum peak value and the threshold value. If the maximum peak value does not exceed the threshold value, the gain calculation component 225 may set the current gain value to a first value (e.g., 1.0 or 0 dB).

Based on the current gain value, the gain calculation component 225 may determine a gain curve to apply to audio samples stored in the look-ahead delay component 215. For example, the look-ahead delay component 215 may store a first number of audio samples (e.g., 96 samples) corresponding to the look-ahead time. As the gain calculation component 225 determines the current gain value for a current audio sample (e.g., sample[n]), the gain calculation component 225 applies a first gain curve to the first number of audio samples preceding the current audio sample (e.g., sample[n−96] to sample[n−1]). Applying the first gain curve like this reduces distortion; instead of an abrupt change in gain values, the gain values gradually decrease over the first number of audio samples until reaching the current gain value applied to the current audio sample (e.g., sample[n]).

Each time that the current gain value is lower than a previous gain value, the gain calculation component 225 may apply an additional gain curve to the first number of audio samples stored in the look-ahead delay component 215. For example, if a subsequent audio sample (e.g., sample[n+1]) triggers a second gain curve, the gain calculation component 225 may determine the subsequent gain value and apply a second gain curve to the first number of audio samples preceding the subsequent audio sample (e.g., sample[n−95] to sample[n]). Thus, the sample-by-sample limiter 200 may apply up to the first number of individual gain curves to a single audio sample (e.g., up to 96 gain curves).

The look-ahead delay component 215 may delay the input signal 210 based on the look-ahead delay and the delayed input signal may be output to a gain component 230 configured to generate an output signal 235. For example, the gain component 230 may apply the current gain value to the current audio sample of the delayed input signal to generate a corresponding audio sample in the output signal 235. However, the disclosure is not limited thereto, and in some examples the gain component 230 may apply a modified gain value to the current audio sample without departing from the disclosure. For example, as described above, the sample-by-sample limiter 200 may apply one or more gain curves to the audio samples stored in the look-ahead delay component 215. Thus, when the current audio sample (e.g., sample[n]) is processed by the gain calculation component 225, the sample-by-sample limiter 200 may associate the current audio sample with the current gain value. However, when a future audio sample (e.g., sample[n+96]) is processed by the gain calculation component 225, the sample-by-sample limiter 200 may have applied up to 96 different gain curves to the current audio sample (e.g., sample[n]), resulting in the sample-by-sample limiter 200 reducing the current gain value up to 96 separate times. Thus, the sample-by-sample limiter 200 may associate the current audio sample (e.g., sample[n]) with the modified gain value calculated based on the current gain value and the number of gain curves applied to the current audio sample without departing from the disclosure.

As illustrated in FIG. 2, the sample-by-sample limiter 200 may determine (250) a maximum peak value for current audio sample(s) and may determine (252) whether the maximum peak value (e.g., Maxpeak) is greater than a threshold value. If it is greater than the threshold value, then the sample-by-sample limiter 200 may perform (254) attack processing by applying a gain curve to the N look-ahead buffers (e.g., audio samples included in the look-ahead delay time). If the maximum peak value is less than the threshold value, the sample-by-sample limiter 200 may perform (256) hold processing or release processing. For example, hold processing corresponds to the sample-by-sample limiter 200 maintaining a current gain value for a fixed duration of time, whereas release processing corresponds to the sample-by-sample limiter 200 applying a release gain curve that begins at the current gain value and releases to gain value of 0 dB (e.g., 1.0 on a linear scale).

Figure 3:
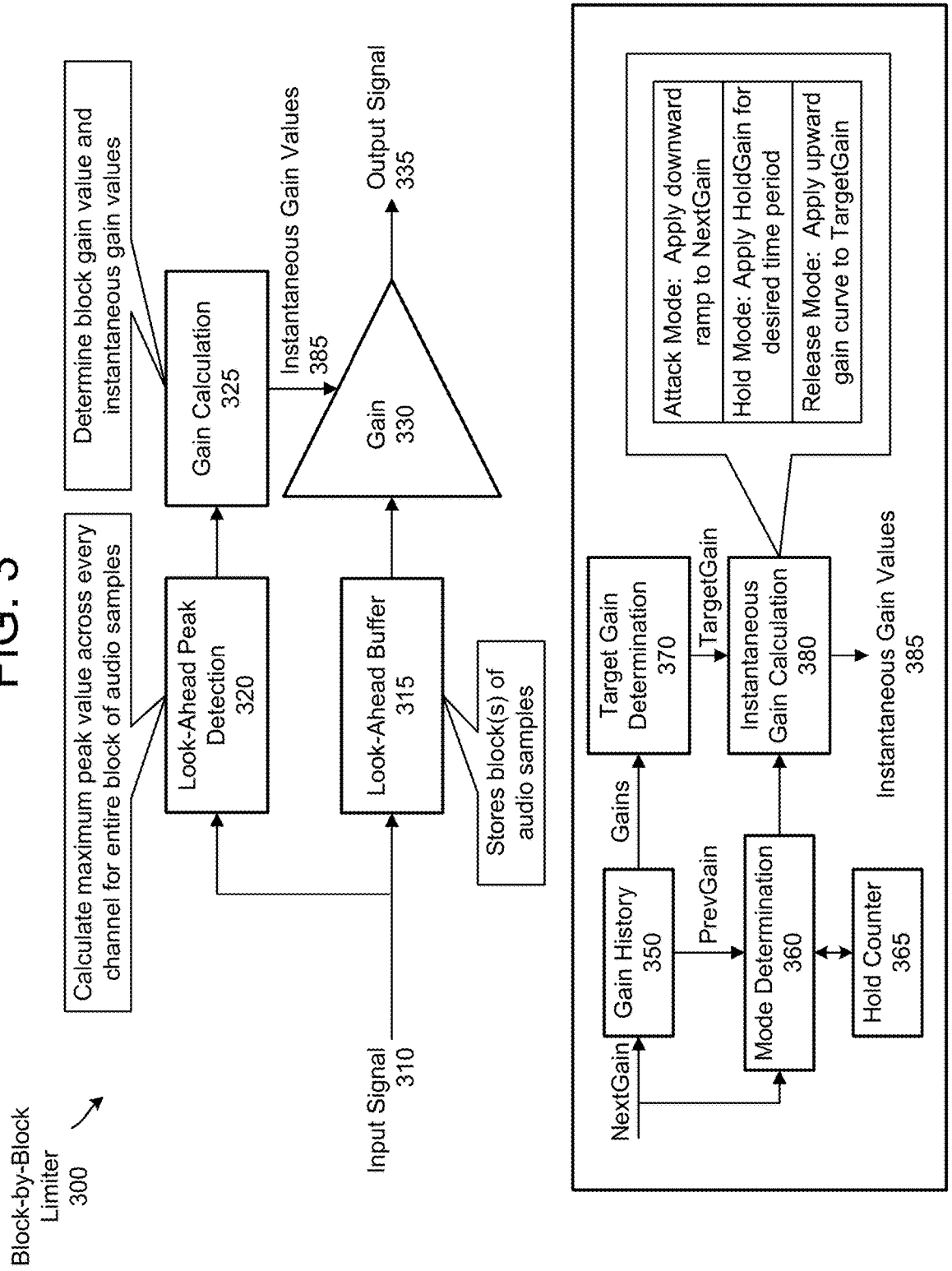
FIG. 3 illustrates an example component diagram of a block-based audio limiter component according to embodiments of the present disclosure.

FIG. 3 illustrates an example component diagram of a block-based audio limiter component according to embodiments of the present disclosure. As described above with regard to FIG. 1, a block-by-block limiter component 300 may perform gain calculations for an entire block of audio samples at a time. To illustrate an example, the block-by-block limiter component 300 may separate audio data into blocks (e.g., audio frames) that are 8 ms long, although the disclosure is not limited thereto. For example, when the input audio data has a sampling rate of 48 kHz, the block-by-block limiter component 300 may process an individual block that includes 384 audio samples, which collectively span the desired duration of time (e.g., 8 ms). However, the disclosure is not limited thereto, and the desired duration of time, the sampling rate, and/or the number of samples may vary without departing from the disclosure.

As described above, the sample-by-sample limiter 200 illustrated in FIG. 2 iteratively processes individual audio samples. When a selected audio sample triggers attack processing (e.g., maximum peak value exceeds a threshold value), the sample-by-sample limiter 200 may apply a gain curve to every audio sample that precedes the selected audio sample within a look-ahead period. Thus, the sample-by-sample limiter 200 may apply the gain curve to N look-ahead buffers (e.g., N previous audio samples). For example, when the input audio data has a sampling rate of 48 kHz and the look-ahead period is 2 ms, the sample-by-sample limiter 200 may apply the gain curve to 96 previous audio samples. Depending on how many subsequent audio samples trigger attack processing, this results in the sample-by-sample limiter 200 performing up to 96 multiplication operations on a selected audio sample. In addition, this iterative processing prevents the sample-by-sample limiter 200 from calculating a gain value for the selected audio sample until the sample-by-sample limiter 200 has already processed every audio sample preceding the selected audio sample.

Instead of applying a plurality of gain curves to an individual audio sample (e.g., up to 96 separate multiplication operations for a single audio sample), as described above, the block-by-block limiter component 300 may process an entire block of audio samples (e.g., 384 audio samples) and apply a single gain curve for each block transition. To illustrate a first example, when a selected block of audio samples triggers attack processing, the block-by-block limiter component 300 may apply a first gain curve (e.g., gain ramp that gradually attenuates the input signal) to audio samples included in a look-ahead period prior to the selected block of audio samples (e.g., portion of the previous block of audio samples). Thus, the first gain curve is applied during the look-ahead period and the new gain value is applied to the selected block of audio samples. To illustrate a second example, when a selected block of audio samples triggers release processing, the block-by-block limiter component 300 may apply a second gain curve (e.g., gain curve that gradually increases the input signal) to audio samples included in the look-ahead period and to the selected block of audio samples (e.g., both the portion of the previous block of audio samples and the selected block of audio samples).

As illustrated in FIG. 3, the block-by-block limiter component 300 may receive an input signal 310 (e.g., input audio data), may store the input signal 310 in a look-ahead buffer component 315, and may process the input signal 310 using a look-ahead peak detection component 320. Instead of only processing a current audio sample (or pair of audio samples), the look-ahead peak detection component 320 may process a plurality of audio samples included in the selected block of audio samples (e.g., selected audio frame). For example, the look-ahead peak detection component 320 may determine a maximum peak value (e.g., MaxPeak), which represents a maximum amplitude value associated with the plurality of audio samples. Thus, the look-ahead peak detection component 320 identifies a single value for the entire block of audio samples (e.g., 8 ms), regardless of the number of channels included in the input signal 310.

For ease of illustration, the look-ahead peak detection component 320 is described as determining a maximum peak value (e.g., MaxPeak). However, the maximum peak value corresponds to a maximum amplitude of the input signal 310, such that the maximum peak value may correspond to a positive peak or a negative peak without departing from the disclosure. For example, the maximum peak value may correspond to a portion of the input signal 310 that exceeds a positive threshold value or is less than a negative threshold value without departing from the disclosure.

Figure 4:
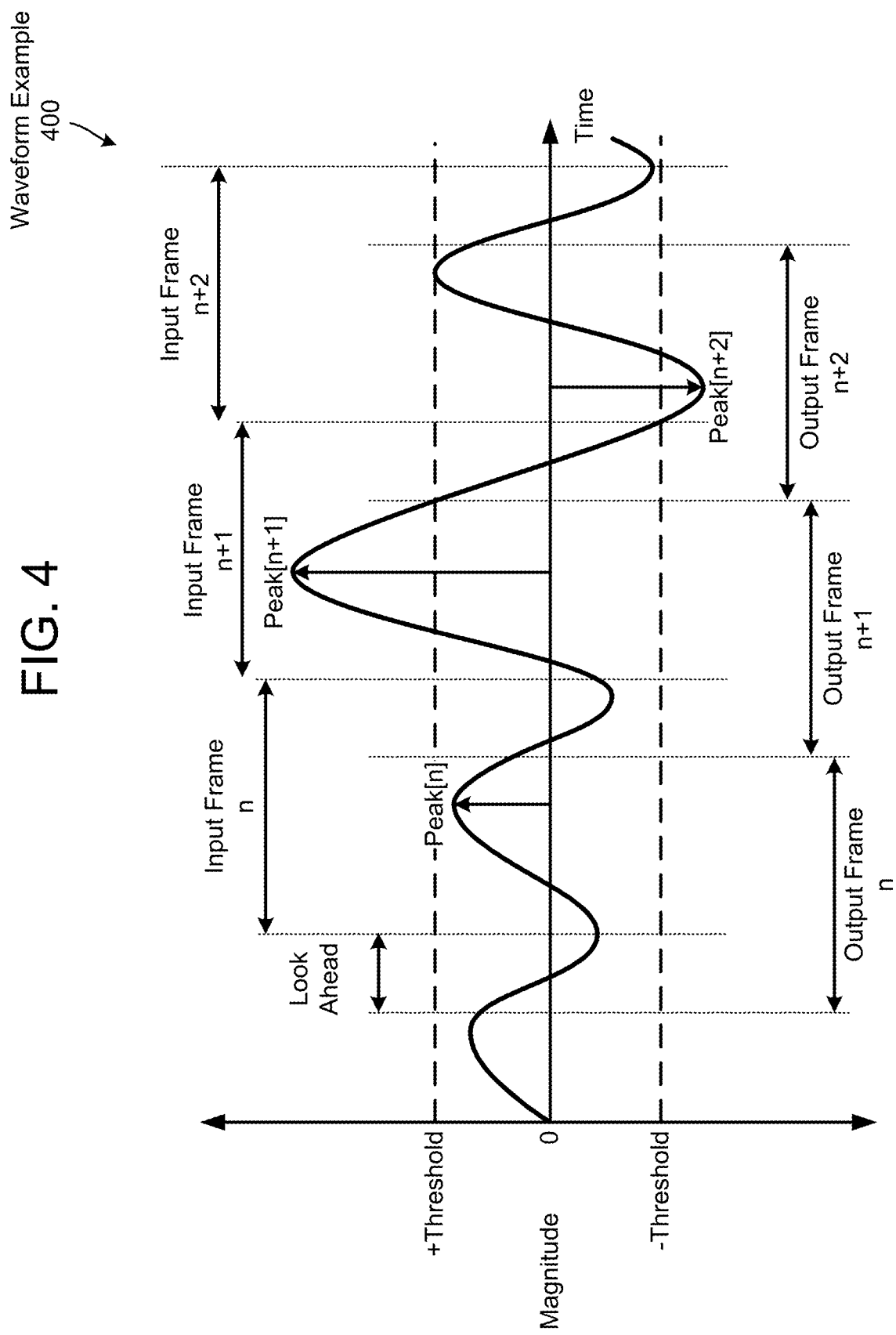
FIG. 4 illustrates an example of input audio data processed by the block-based audio limiter component according to embodiments of the present disclosure.

FIG. 4 illustrates an example of input audio data processed by the block-based audio limiter component according to embodiments of the present disclosure. As illustrated in FIG. 4, a waveform example 400 represents the input signal 310 as a series of positive and negative peaks. Based on a number of audio samples included in an individual audio frame, the block-by-block limiter component 300 may separate the input signal 310 into a series of discrete non-overlapping audio frames (e.g., blocks of audio samples). As described above, in some examples the block-by-block limiter component 300 may separate the input signal 310 into audio frames having a first time window (e.g., 8 ms), such that each audio frame includes a first number of audio samples (e.g., 384 audio samples), although the disclosure is not limited thereto.

As illustrated in FIG. 4, the block-by-block limiter component 300 may separate the input signal 310 into a first input frame n (e.g., Input[n]), a second input frame n+1 (e.g., Input[n+1]), and a third input frame n+2 (e.g., Input[n+2]). The look-ahead peak detection component 320 may process an individual input frame to identify a maximum amplitude value (e.g., maximum peak value) within the selected input frame. As illustrated in FIG. 4, the look-ahead peak detection component 320 may associate the first input frame Input[n] with a first peak value (e.g., Peak[n]) corresponding to a first peak, the second input frame Input[n+1] with a second peak value (e.g., Peak[n+1]) corresponding to a second peak, and the third input frame Input[n+2] with a third peak value (e.g., Peak[n+2]) corresponding to a third peak. While the third peak has a negative magnitude, the third peak value (e.g., Peak[n+2]) is positive as it corresponds to the maximum amplitude of the third peak (e.g., absolute value of the magnitude).

After the look-ahead peak detection component 320 determines the maximum peak value for the selected audio frame, a gain calculation component 325 may use the maximum peak value to determine a block gain value for the selected audio frame. For example, the gain calculation component 325 may first determine whether the maximum peak value exceeds a threshold value to determine whether to attenuate the input signal 310. If the maximum peak value is less than or equal to the threshold value, the gain calculation component 325 may set the block gain value to a first value (e.g., equal to 1.0 or 0 dB) in order to pass the input signal 310 without attenuation. However, if the maximum peak value exceeds the threshold value, the gain calculation component 325 may determine the block gain value by dividing the threshold value by the maximum peak value (e.g., Gain=Threshold/Peak). This determines the amount of gain (e.g., attenuation) to apply to the selected block of audio samples in order to avoid clipping caused by the input signal 310 exceeding the threshold value.

Figure 5:
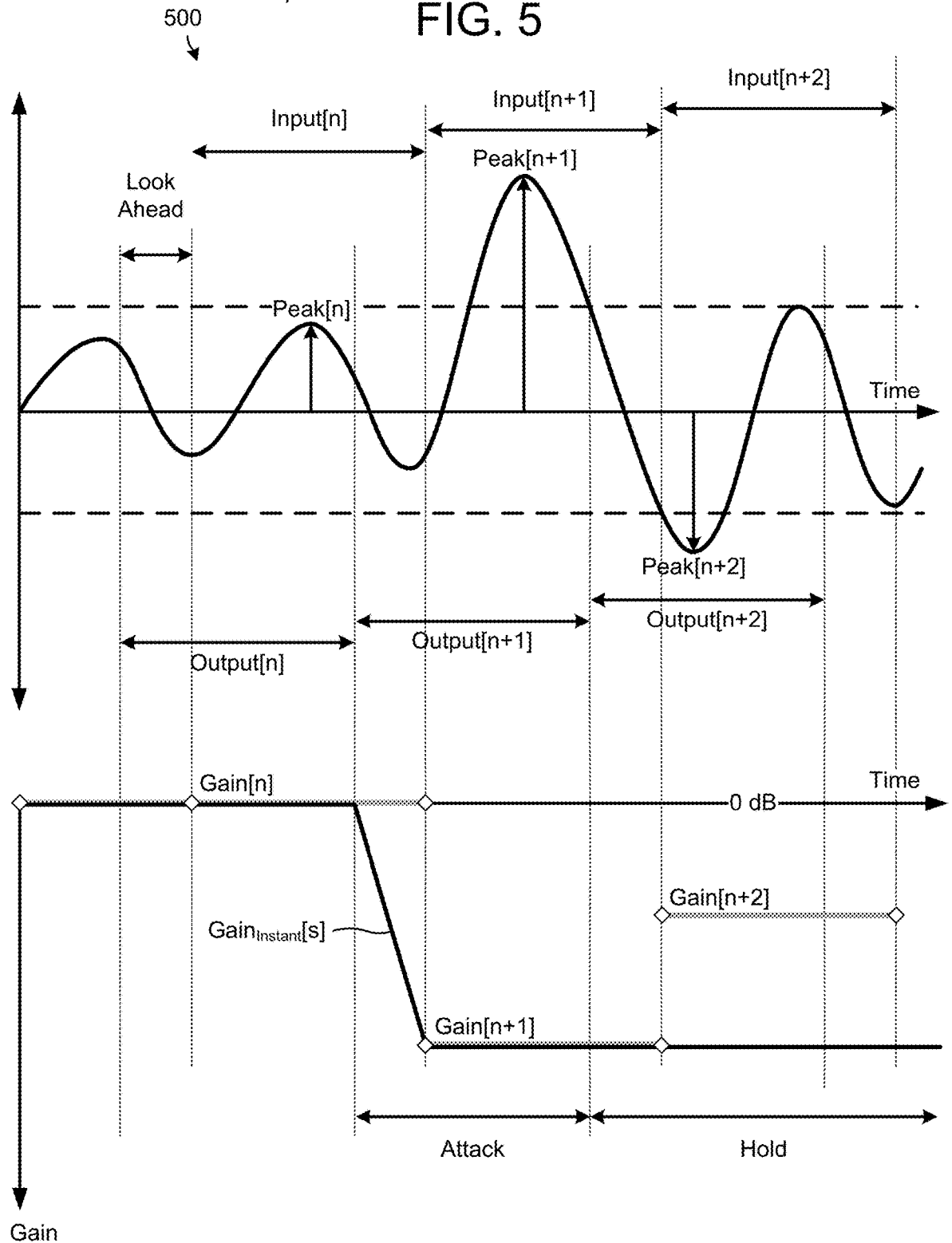
FIG. 5 illustrates an example of calculating gain values for the input audio data using the block-based audio limiter component according to embodiments of the present disclosure.

FIG. 5 illustrates an example of calculating gain values for the input audio data using the block-based audio limiter component according to embodiments of the present disclosure. As illustrated in FIG. 5, the block-by-block limiter component 300 may use a maximum peak value to determine a block gain value for a selected input frame. For example, FIG. 5 illustrates a gain calculation example 500 in which the block-by-block limiter component 300 uses the first peak value (e.g., Peak[n]) to determine a first block gain value (e.g., Gain[n]) for the first input frame Input[n], the second peak value (e.g., Peak[n+1]) to determine a second block gain value (e.g., Gain[n+1]) for the second input frame Input[n+1], and the third peak value (e.g., Peak[n+2]) to determine a third block gain value (e.g., Gain[n+2]) for the third input frame Input[n+2].

To reduce distortion, the block-by-block limiter component 300 may transition between adjacent block gain values during a look ahead period that precedes an input frame. For example, FIG. 5 illustrates that the block-by-block limiter component 300 may generate instantaneous gain values, represented by an instantaneous gain value function (e.g., $Gain_{Instant}[s]$), that transition from the first block gain value Gain[n] associated with the first input frame Input[n] to the second block gain value Gain[n+1] associated with the second input frame Input[n+1] during a second look ahead period (e.g., second portion of the first input frame Input[n]).

Thus, the block-by-block limiter component 300 may transition from a previous block gain value (e.g., Gain[n−1]) associated with a previous input frame (e.g., Input[n−1]) to the first block gain value Gain[n] associated with the first input frame Input[n] during a first look ahead period (e.g., second portion of the previous input frame Input[n−1]), may transition from the first block gain value Gain[n] to the second block gain value Gain[n+1] associated with the second input frame Input[n+1] during a second look ahead period (e.g., second portion of the first input frame Input[n]), may transition from the second block gain value Gain[n+1] to the third block gain value Gain[n+2] associated with the third input frame Input[n+2] during a third look ahead period (e.g., second portion of the second input frame Input[n+1]), and so on.

In some examples, the look ahead periods may correspond to a desired lookahead time, which is a fraction of an overall duration of time associated with an input frame. For example, the lookahead time may correspond to a first duration of time (e.g., 2 ms) that is one quarter of the overall duration of time associated with the input frame (e.g., 8 ms), although the disclosure is not limited thereto.

While the block-by-block limiter component 300 may process the input signal 310 and determine the block gain values using the input frames (e.g., Input[n]-Input[n+2]), in some examples the block-by-block limiter component 300 may generate output data using output frames that are offset from the input frames by the lookahead time. For example, a first output frame (e.g., Output[n]) may include the first look ahead period (e.g., second portion of the previous input frame Input[n−1]) and a first portion of the first input frame Input[n], a second output frame (e.g., Output[n+1]) may include the second look ahead period (e.g., second portion of the first input frame Input[n]) and a first portion of the second input frame Input[n+1], and a third output frame (e.g., Output[n+2]) may include the third look ahead period (e.g., second portion of the second input frame Input[n+1]) and a first portion of the third input frame Input[n+2], and so on.

In some examples, the block-by-block limiter component 300 may be configured to perform attenuation, as described above (e.g., attenuate signals exceeding the threshold value and pass signals below the threshold value). Thus, the block gain value may reduce the maximum amplitude of the input signal 310. However, the disclosure is not limited thereto and in other examples the block-by-block limiter component 300 may be configured to perform attenuation and amplification (e.g., attenuate signals exceeding the threshold value and amplify signals below the threshold value) without departing from the disclosure. For example, the block-by-block limiter component 300 may be configured to perform loudness control to selectively amplify/attenuate the input signal 310 to a desired level without departing from the disclosure. Thus, the block gain value may either reduce or increase the maximum amplitude of the input signal 310, depending on whether the maximum peak value is above or below the threshold value.

While not illustrated in FIG. 3, the device 110 may be configured to use the techniques described herein to perform amplification (e.g., amplify signals below the threshold value) without departing from the disclosure. For example, the device 110 may be configured to perform amplification to selectively amplify the input signal 310 to a desired level without departing from the disclosure. Thus, the block gain value may increase the maximum amplitude of the input signal 310 (e.g., when the maximum peak value is below the threshold value) or pass the input signal 310 without attenuation (e.g., when the maximum peak value is above the threshold value) without departing from the disclosure.

Using the block gain value, the gain calculation component 325 may determine instantaneous gain values for the input signal 310. In some examples, the gain calculation component 325 may calculate first instantaneous gain values for first audio samples included in a look-ahead period preceding the selected block of audio samples, may calculate second instantaneous gain values for second audio samples included in a first portion of the selected block of audio samples, and may calculate third instantaneous gain values for third audio samples included in a second portion of the selected block of audio samples. For example, the first audio samples may correspond to a first look-ahead period within a first audio frame, the second audio samples may correspond to a first portion of a second audio frame, and the third audio samples may correspond to a second look-ahead period within the second audio frame. Thus, the first instantaneous gain values transition from a first block gain value associated with the first audio frame to a second block gain value associated with the second audio frame, while the third instantaneous gain values transition from the second block gain value to a third block gain value associated with a third audio frame.

As described above with regard to FIG. 1, the block-by-block limiter component 300 may determine the instantaneous gain values based on one of three processing modes: 1) attack mode (e.g., attack processing), 2) hold mode (e.g., hold processing), or 3) release mode (e.g., release processing). For example, if the input signal 310 only exceeds the threshold value for a single audio frame, the block-by-block limiter component 300 may calculate a first plurality of instantaneous gain values using the attack mode (e.g., gradually attenuating the input signal 310 to a desired gain value so that the input signal 310 does not exceed the threshold value), a second plurality of instantaneous gain values using the hold mode (e.g., maintaining the desired gain value for a period of time), and a third plurality of instantaneous gain values using the release mode (e.g., gradually increasing the gain value applied to the input signal 310).

Figure 6:
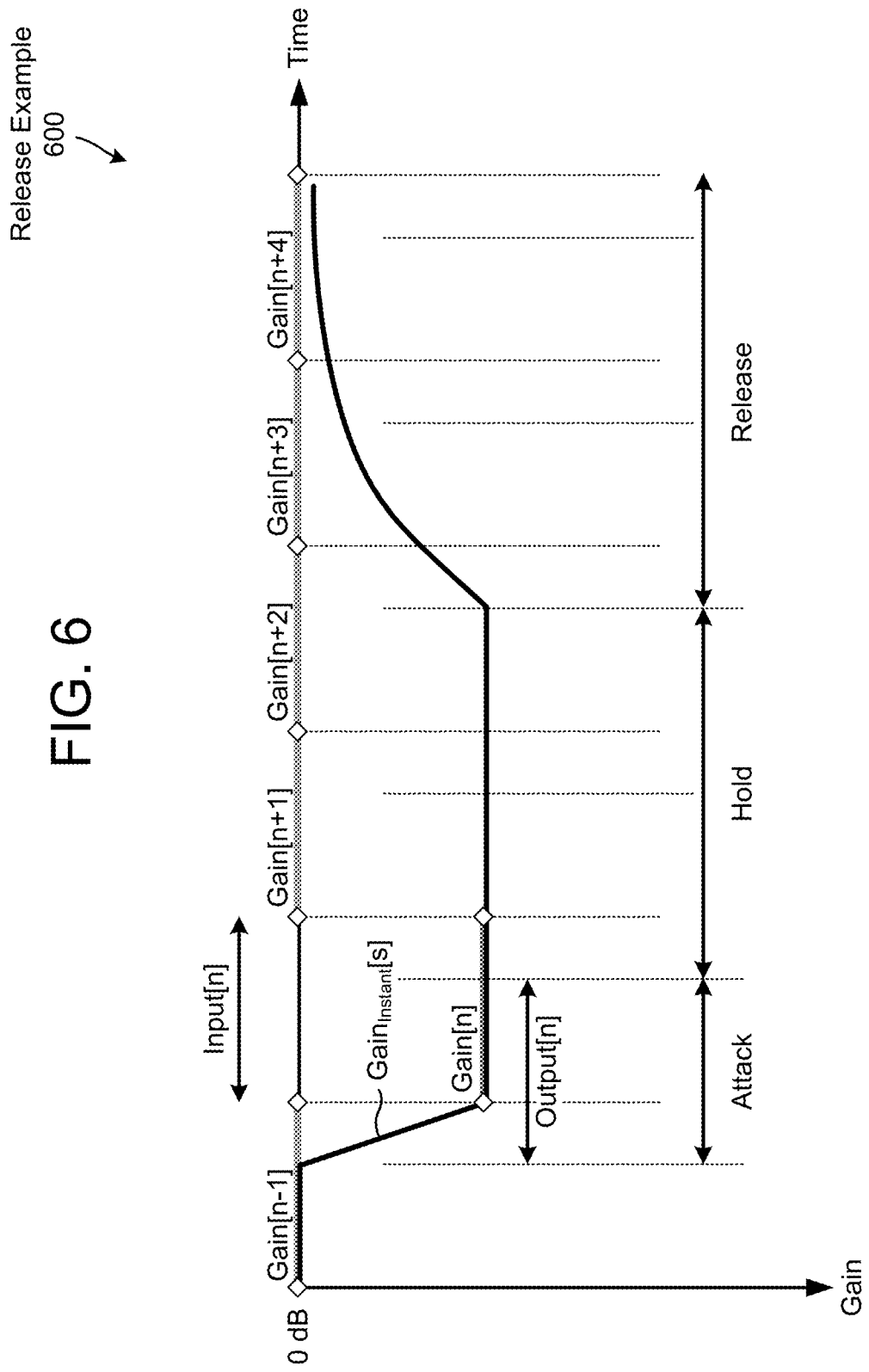
FIG. 6 illustrates an example of release processing using the block-based audio limiter component according to embodiments of the present disclosure.

FIG. 6 illustrates an example of release processing using the block-based audio limiter component according to embodiments of the present disclosure. As illustrated in FIG. 6, a release example 600 illustrates an example in which the input signal 310 only exceeds the threshold value for a single audio frame (e.g., first input frame Input[n]). As the input signal 310 does not exceed the threshold value for the remaining input frames, all of the block gain values (e.g., Gain[n−1] and Gain[n+1]–Gain[n+4]) are set equal to a first value (e.g., value of 1.0 or 0 dB).

As the first block gain value Gain[n] is less than a previous block gain value Gain[n−1], the block-by-block limiter component 300 may enter attack mode to determine the first plurality of instantaneous gain values associated with the first input frame Input[n]. For example, during attack mode the block-by-block limiter component 300 may use a first gain curve (e.g., downward ramp) to gradually reduce the instantaneous gain values to the first block gain value Gain[n]. However, as the second block gain value Gain[n+1] is greater than the first block gain value Gain[n], the block-by-block limiter component 300 may enter the hold mode and may maintain the first block gain value Gain[n] for a period of time (e.g., hold time). In the release example 600 illustrated in FIG. 6, the block-by-block limiter component 300 may remain in the hold mode and maintain the first block gain value Gain[n] for two input frames (e.g., Input[n+1] and Input[n+2]). Thus, the block-by-block limiter component 300 determines the second plurality of instantaneous gain values that are associated with the second input frame Input[n+1] and the third input frame Input[n+2]. However, the disclosure is not limited thereto and the hold time may vary without departing from the disclosure.

As the release example 600 illustrates an example in which subsequent block gain values continue to be larger than the first block gain value Gain[n], after the hold time elapses the block-by-block limiter component 300 enters release mode and determines the third plurality of instantaneous gain values. As illustrated in FIG. 6, the third plurality of instantaneous gain values may correspond to a fourth input frame Input[n+3] and a fifth input frame Input[n+4] and may gradually increase the instantaneous gain values from the first block gain value Gain[n] to the fifth block gain value Gain[n+4]. Thus, the block-by-block limiter component 300 may generate the instantaneous gain values, which are represented in FIG. 6 by an instantaneous gain value function (e.g., $Gain_{Instant}[s]$).

Referring back to the bottom of FIG. 3, the block-by-block limiter component 300 may store the block gain value in a gain history component 350. In some examples, the gain history component 350 may store a first number of block gain values. For example, the gain history component 350 may correspond to a circular buffer that stores them most recent block gain values (e.g., five most recent block gain values, which correspond to the five most recent audio frames), although the disclosure is not limited thereto.

The block-by-block limiter component 300 may include a mode determination component 360 configured to determine the processing mode with which to determine the instantaneous gain values. In some examples, the mode determination component 360 may determine the processing mode based on a transition gain value associated with the first audio frame, the second block gain value associated with the second audio frame (e.g., next gain value NextGain), and/or a hold counter component 365. For example, the block-by-block limiter component 300 may compare the transition gain value to the second block gain value to determine whether to enter attack mode.

The transition gain value corresponds to an instantaneous gain value (e.g., per sample gain value) for a final audio sample before the lookahead period of the first audio frame (e.g., prior to a beginning of the lookahead portion of the first audio frame). When the instantaneous gain values are relatively uniform prior to the lookahead period (e.g., during attack mode and hold mode), the transition gain value may correspond to a current block gain value applied to the first audio frame. For example, if the block-by-block limiter component 300 associated the first audio frame with attack mode, the transition gain value corresponds to the first block gain value (e.g., previous gain value PrevGain). Similarly, if the block-by-block limiter component 300 associated the first audio frame with the hold mode, the transition gain value corresponds to the current block gain value (e.g., HoldGain) associated with the most recent attack mode. In contrast, if the block-by-block limiter component 300 associated the first audio frame with release mode, the transition gain value corresponds to an instantaneous gain value associated with the final audio sample before the lookahead period of the first audio frame. Thus, as the release mode releases the gain from a current block gain value to a target block gain value using a gain curve, the transition gain value is a discrete point between the current block gain value and the target block gain value along the gain curve.

The block-by-block limiter component 300 may compare the second block gain value to the transition gain value and determine whether the second block gain value (e.g., NextGain) is greater than the transition gain value. If the second block gain value is less than or equal to the transition gain value, this indicates that the block-by-block limiter component 300 needs to further attenuate the input signal 310 and the block-by-block limiter component 300 enters attack mode. When the block-by-block limiter component 300 enters the attack mode, the block-by-block limiter component 300 may reset the hold counter component 365 based on a desired hold time.

If the second block gain value is greater than the transition gain value, the block-by-block limiter component 300 may determine whether a duration of time (e.g., desired hold time) has elapsed since entering the most recent attack mode. For example, the block-by-block limiter component 300 may retrieve a current value of the hold counter component 365 and determine whether the duration of time has elapsed based on the current value. In some examples, upon entering attack mode, the block-by-block limiter component 300 may reset the hold counter component 365 to a value of zero and may increment the hold counter component 365 after each audio frame is processed during the hold mode. Thus, the block-by-block limiter component 300 determines that the duration of time has not elapsed if the current value is less than a hold threshold value (e.g., number of audio frames corresponding to the desired hold time). In other examples, the block-by-block limiter component 300 may reset the hold counter component 365 to the hold threshold value and may decrement the hold counter component 365 after each audio frame is processed during the hold mode. Thus, the block-by-block limiter component 300 determines that the duration of time has not elapsed if the current value is a positive integer. However, the disclosure is not limited thereto and the block-by-block limiter component 300 may determine whether the duration of time has elapsed using other techniques without departing from the disclosure.

If the block-by-block limiter component 300 determines that the duration of time has not elapsed, the block-by-block limiter component 300 may enter hold mode. However, if the block-by-block limiter component 300 determines that the duration of time has elapsed, the block-by-block limiter component 300 may enter release mode.

As illustrated in FIG. 3, the mode determination component 360 may output the selected mode to an instantaneous gain calculation component 380. The instantaneous gain calculation component 380 may receive the selected mode and corresponding block gain value(s) (e.g., PrevGain, NextGain, HoldGain, and/or TargetGain) and may determine instantaneous gain values 385 using the selected processing mode. For example, the instantaneous gain calculation component 380 may use the block gain value(s) associated with a block of audio samples to determine a series of instantaneous gain values 385 (e.g., sample gain values for individual audio samples) for the block of audio samples.

During attack mode, the block-by-block limiter component 300 may apply a first gain curve (e.g., downward ramp, which may be linear, although the disclosure is not limited thereto) to transition from the first block gain value (e.g., PrevGain) to the second block gain value (e.g., NextGain) and may maintain the second block gain value. Thus, the block-by-block limiter component 300 gradually reduces the input signal 310 and then applies the second block gain value to at least a portion of the second audio frame.

In contrast, during hold mode the block-by-block limiter component 300 may ignore the second block gain value (e.g., NextGain) and may continue to apply a current block gain value (e.g., HoldGain) to at least a portion of the second audio frame. In some examples, such as when the block-by-block limiter component 300 initially enters the hold mode, the current block gain value (e.g., HoldGain) is equal to the first block gain value (e.g., PrevGain). However, the disclosure is not limited thereto, and in other examples the current block gain value (e.g., HoldGain) is equal to a block gain value associated with the most recent attack mode. For example, if the hold mode began with the first audio frame, the current block gain value (e.g., HoldGain) would be equal to a third block gain value associated with a third audio frame that preceded the first audio frame, meaning that the block-by-block limiter component 300 entered attack mode in response to the third block gain.

The block-by-block limiter component 300 remains in hold mode based on the desired hold time associated with the hold counter component 365. For example, the block-by-block limiter component 300 may compare a current value of the hold counter component 365 to a hold threshold value, which indicates a number of audio frames corresponding to the desired hold time. In some examples, the block-by-block limiter component 300 may maintain hold mode for three audio frames. For example, the block-by-block limiter component 300 may enter attack mode using the first block gain value during the first audio frame and may maintain the first block gain value (e.g., HoldGain) for three subsequent audio frames, such that the block-by-block limiter component 300 enters release mode for a fifth audio frame. However, the disclosure is not limited thereto, and the block-by-block limiter component 300 may maintain hold mode for any number of audio frames without departing from the disclosure. For ease of illustration, the following drawings illustrate the block-by-block limiter component 300 maintaining hold mode for two subsequence audio frames, although the disclosure is not limited thereto.

During release mode, the block-by-block limiter component 300 may apply a second gain curve (e.g., upward sloping curve) to transition from the current block gain value (e.g., HoldGain). As illustrated in FIG. 3, in some examples the block-by-block limiter component 300 may transition from the current block gain value (e.g., HoldGain) to a target block gain value (e.g., TargetGain). For example, the block-by-block limiter component 300 may include a target gain determination component 370 that is configured to receive a plurality of block gain values stored in the gain history component 350, determine a minimum block gain value from the plurality of block gain values, and set the target block gain value (e.g., TargetGain) based on the minimum block gain value. Thus, the block-by-block limiter component 300 only releases the input signal 310 based on the lowest block gain value within a period of time (e.g., three audio frames, although the disclosure is not limited thereto). However, the disclosure is not limited thereto, and in other examples the block-by-block limiter component 300 may transition from the current block gain value (e.g., HoldGain) to the second block gain value (e.g., NextGain) without departing from the disclosure. Thus, the block-by-block limiter component 300 may gradually increase the input signal 310 based on the second block gain value without departing from the disclosure.

In some examples, the block-by-block limiter component 300 may release the gain towards the target block gain value (e.g., TargetGain), as described above. For example, while processing a current block of audio samples, the block-by-block limiter component 300 may determine the target block gain value based on a first minimum block gain value applied during a first period of time prior to the current block of audio samples and may release the gain towards the first minimum block gain value. Then, while processing a subsequent block of audio samples, the block-by-block limiter component 300 may adjust the target block gain value based on a second minimum block gain value applied during a second prior of time prior to the subsequent block of audio samples. Thus, during release mode the block-by-block limiter component 300 releases the gain toward the target block gain value and may later adjust the target block gain value over time.

In other examples, the block-by-block limiter component 300 may release the gain towards a target block gain value determined using gain minima tracking processing. For example, the target block gain value (e.g., TargetGain) may be calculated without having to find a minimum block gain value applied during the first period of time prior to the current block of audio samples. Instead, the block-by-block limiter component 300 may use a frame counter that represents the "age" of the current target block gain value (e.g., number of audio frames to which the current target block gain value has been applied), along with a future target block gain value (e.g., nextTargetGain). Each time the target block gain value is updated to a new value, the minimum value of subsequent block gain values is stored as the future target block gain value (e.g., nextTargetGain).

Thus, using the gain minima tracking processing, there are two ways in which the block-by-block limiter component 300 may update the target block gain value (e.g., TargetGain). In a first example, when the target block gain value reaches an age equal to the hold time (e.g., frame counter is equal to a value of three, although the disclosure is not limited thereto), the block-by-block limiter component 300 may update the target block gain value by replacing the target block gain value with the future target block gain value (e.g., TargetGain=nextTargetGain), resetting the future target block gain value to a value of 0 dB (e.g., nextTargetGain=0 dB), and resetting the frame counter. In a second example, when the second block gain value (e.g., NextGain) is smaller than the target block gain value (e.g., TargetGain>NextGain), the block-by-block limiter component 300 may update the target block gain value by replacing the target block gain value with the second target block gain value (e.g., TargetGain=NextGain).

In some examples, the second gain curve may correspond to a nonlinear function, such as a logarithmic function, without departing from the disclosure. For example, the second gain curve may be associated with a release time constant, such that the block-by-block limiter component 300 may transition from the current block gain value (e.g., HoldGain) to the target block gain value (e.g., TargetGain) using the release time constant. The block-by-block limiter component 300 may implement the release time constant using a leaky integrator and/or the like, although the disclosure is not limited thereto. Additionally or alternatively, the second gain curve may asymptomatically approach the target block gain value (e.g., TargetGain), although the disclosure is not limited thereto. For example, the block-by-block limiter component 300 may select the target block gain value and release the gain to the target block gain value using an asymptotic curve that converges on the target block gain value.

Based on the processing modes described above, the instantaneous gain calculation component 380 may determine the instantaneous gain values 385 using the selected processing mode and corresponding block gain value(s) (e.g., PrevGain, NextGain, HoldGain, and/or TargetGain). For example, the instantaneous gain calculation component 380 may use the block gain value(s) associated with a block of audio samples to determine a series of instantaneous gain values 385 (e.g., sample gain values for individual audio samples) for the block of audio samples. Thus, the gain calculation component 325 may generate the instantaneous gain values 385 and output the instantaneous gain values 385 to a gain component 330.

In addition to receiving the instantaneous gain values 385 from the gain calculation component 325, the gain component 330 may receive the input signal 310 from the look-ahead buffer component 315. For example, the look-ahead buffer component 315 may output the input signal 310 after a brief delay corresponding to the look-ahead period, although the disclosure is not limited thereto. The gain component 330 may then apply the instantaneous gain values 385 to at least a portion of the input signal 310 to generate an output signal 335.

Figure 7:
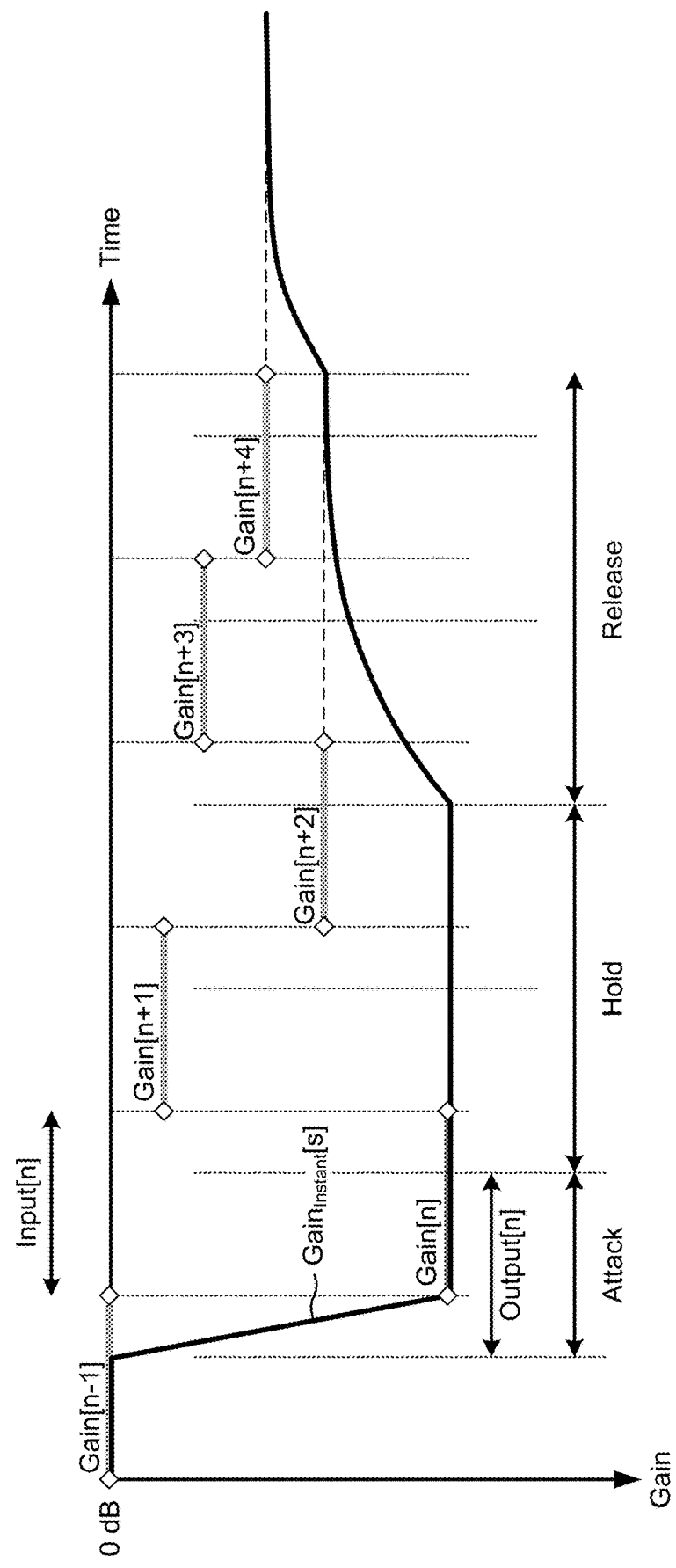
FIG. 7 illustrates an example of controlled release processing using the block-based audio limiter component according to embodiments of the present disclosure.

FIG. 7 illustrates an example of controlled release processing using the block-based audio limiter component according to embodiments of the present disclosure. Unlike the release example 600 illustrated in FIG. 6, FIG. 7 illustrates a controlled release example 700 in which the input signal 310 exceeds the threshold value for multiple input frames. For example, the controlled release example 700 corresponds to the input signal 310 exceeding the threshold value from the first input frame Input[n] to at least the fifth input frame Input[n+4].

While the second block gain value Gain[n+1] is different than the third block gain value Gain[n+2], both the second block gain value Gain[n+1] and the third block gain value Gain[n+2] are larger than the first block gain value Gain[n]. Thus, the block-by-block limiter component 300 may remain in hold mode and maintain the first block gain value Gain[n] during the hold time (e.g., the second input frame Input [n+1] and the third input frame Input [n+2]). However, the hold time elapses after the third input frame Input [n+2], which causes the block-by-block limiter component 300 to enter release mode.

While the release example 600 illustrated in FIG. 6 released the instantaneous gain values from the first block gain value Gain[n] to the fifth block gain value Gain[n+4], the disclosure is not limited thereto. In some examples, the block-by-block limiter component 300 may determine a target block gain value (e.g., TargetGain). For example, the block-by-block limiter component 300 may determine the target block gain value based on a minimum block gain value applied within a period of time. In the controlled release example 700 illustrated in FIG. 7, the minimum block gain value is determined based on block gain values applied during the previous three input frames, although the disclosure is not limited thereto.

After the third input frame Input[n+2], a conventional release mode would transition from the first block gain value Gain[n] to the fourth block gain value Gain[n+3] associated with the fourth input frame Input[n+3]. In the controlled release example 700, however, the block-by-block limiter component 300 determines the target block gain value (e.g., TargetGain) based on the third block gain value Gain[n+2] associated with the third input frame Input[n+2]. Thus, in the controlled release example 700, after the third input frame Input[n+2] the block-by-block limiter component 300 transitions from the first block gain value Gain[n] to the target block gain value, which is the third block gain value Gain[n+2].

Similarly, after the fifth input frame Input[n+4], a conventional release mode would transition from the third block gain value Gain[n+2] to a subsequent block gain value (not illustrated) associated with a subsequent input frame. In the controlled release example 700, however, the block-by-block limiter component 300 determines a new target block gain value (e.g., TargetGain) based on the fifth block gain value Gain[n+4] associated with the fifth input frame Input [n+4]. Thus, in the controlled release example 700, after the fifth input frame Input[n+4] the block-by-block limiter component 300 transitions from the third block gain value Gain[n+2] to the target block gain value, which is the fifth block gain value Gain[n+4].

Figure 8:
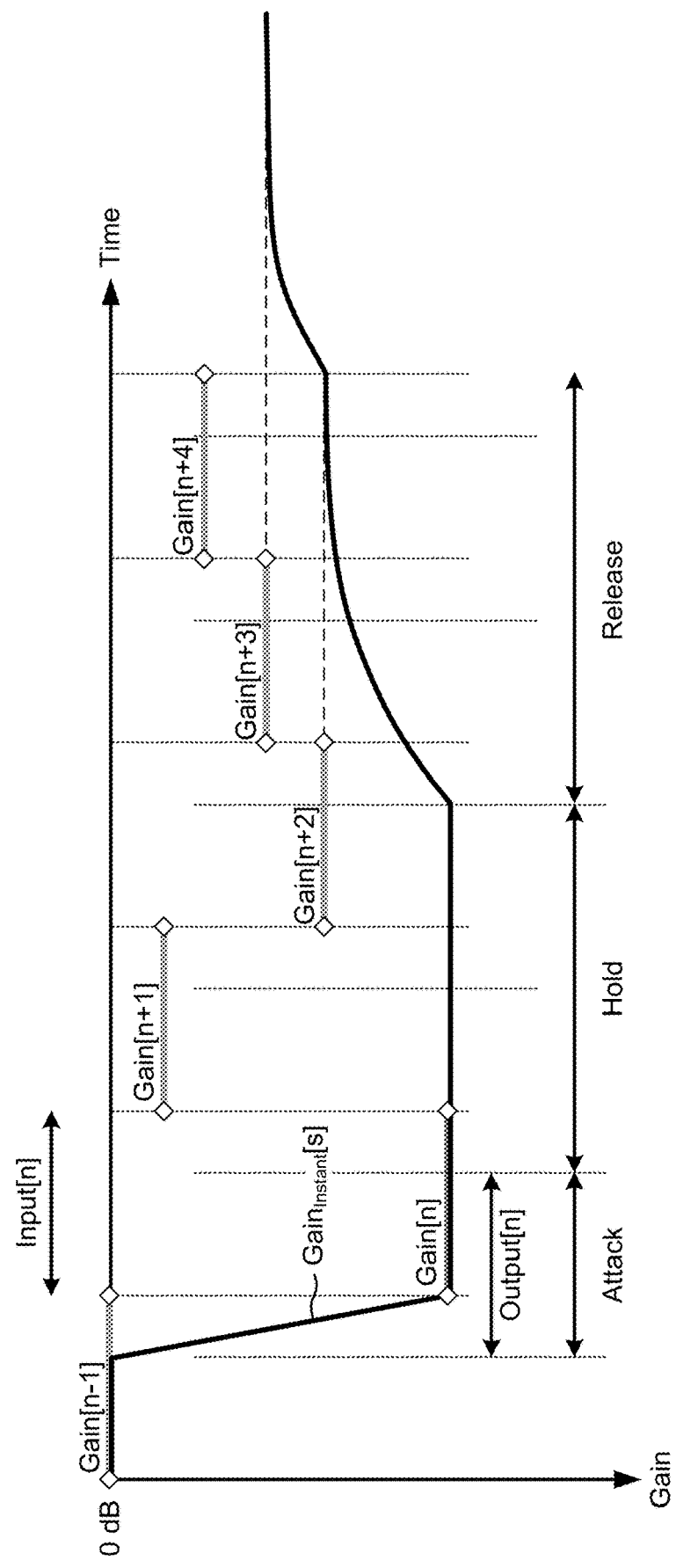
FIG. 8 illustrates an example of controlled release processing using the block-based audio limiter component according to embodiments of the present disclosure.

FIG. 8 illustrates an example of controlled release processing using the block-based audio limiter component according to embodiments of the present disclosure. FIG. 8 illustrates a controlled release example 800 in which the order of the block gain values is changed relative to the controlled release example 700 illustrated in FIG. 7. For example, the fourth block gain value Gain[n+3] and the fifth block gain value Gain[n+4] are reversed in the controlled release example 800, resulting in a gradual increase from the third block gain value Gain[n+2] to the fourth block gain value Gain[n+3] to the fifth block gain value Gain[n+4]. Despite the change in order, the controlled release example 800 illustrates that the block-by-block limiter component 300 selects the same target block gain values and generates identical instantaneous gain values, which are represented by an instantaneous gain value function (e.g., $Gain_{Instant}[s]$).

Figure 9:
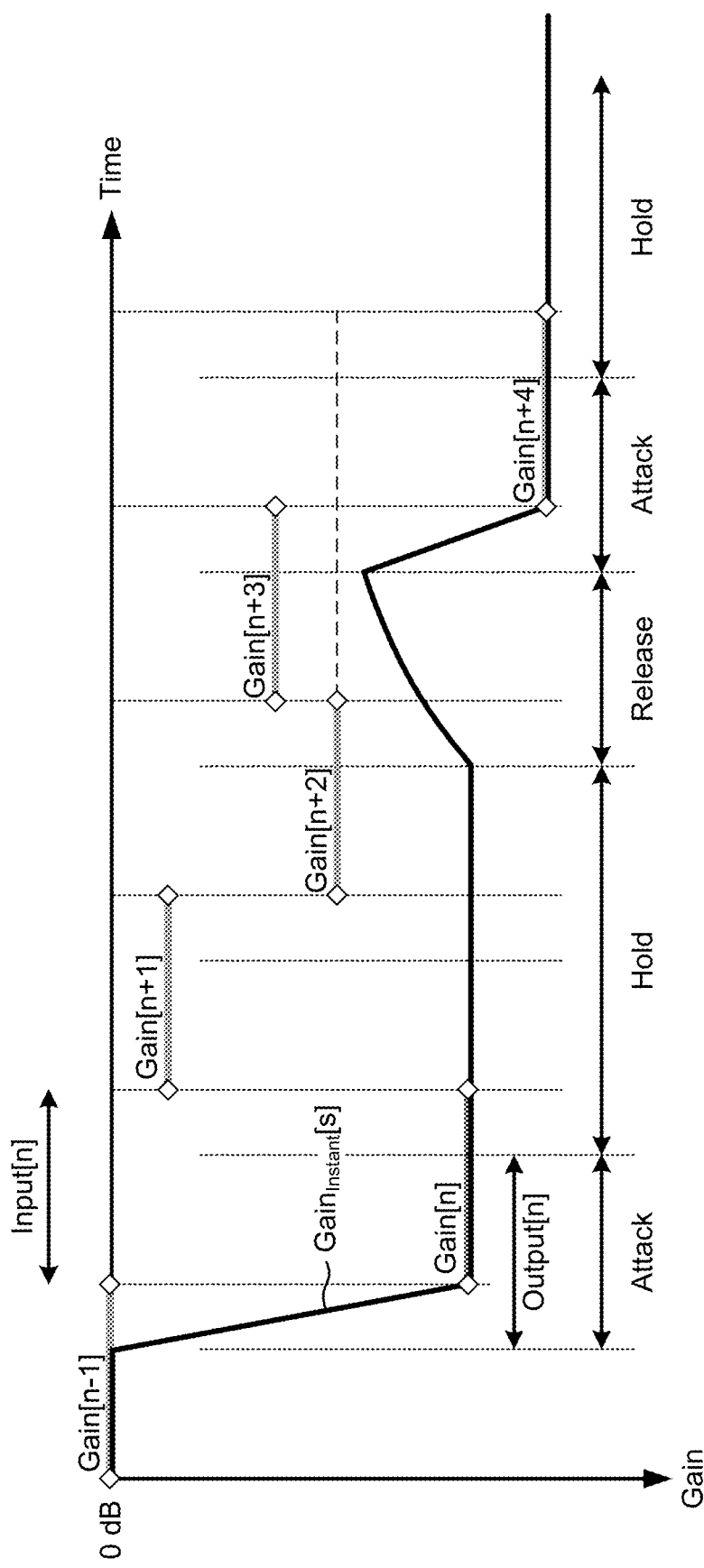
FIG. 9 illustrates an example of release processing followed by attack processing using the block-based audio limiter component according to embodiments of the present disclosure.

FIG. 9 illustrates an example of release processing followed by attack processing using the block-based audio limiter component according to embodiments of the present disclosure. FIG. 9 illustrates a release-attack example 900 that is similar to the controlled release examples illustrated in FIGS. 7-8, except that the fifth block gain value Gain[n+4] is less than the third block gain value Gain[n+3], triggering the block-by-block limiter component 300 to enter a second attack mode. As illustrated in FIG. 9, the block-by-block limiter component 300 may transition from a current instantaneous gain value to the fifth block gain value Gain [n+4] using a first gain curve (e.g., downward ramp) and then may maintain the fifth block gain value Gain[n+4]. After the second attack mode, the block-by-block limiter component 300 enters a second hold mode and maintains the fifth block gain value Gain[n+4] for the hold time.

While FIGS. 3-9 illustrate an example of processing a block of audio samples using a single block gain value (e.g., fullband processing), the disclosure is not limited thereto. In some examples, the block-by-block limiter component 300 may separately process multiple frequency ranges within the block of audio samples (e.g., multiband processing) without departing from the disclosure. For example, the block-by-block limiter component 300 may process a first frequency range within the block of audio samples using a first block gain value and may process a second frequency range within the block of audio samples using a second block gain value without departing from the disclosure.

Figure 10:
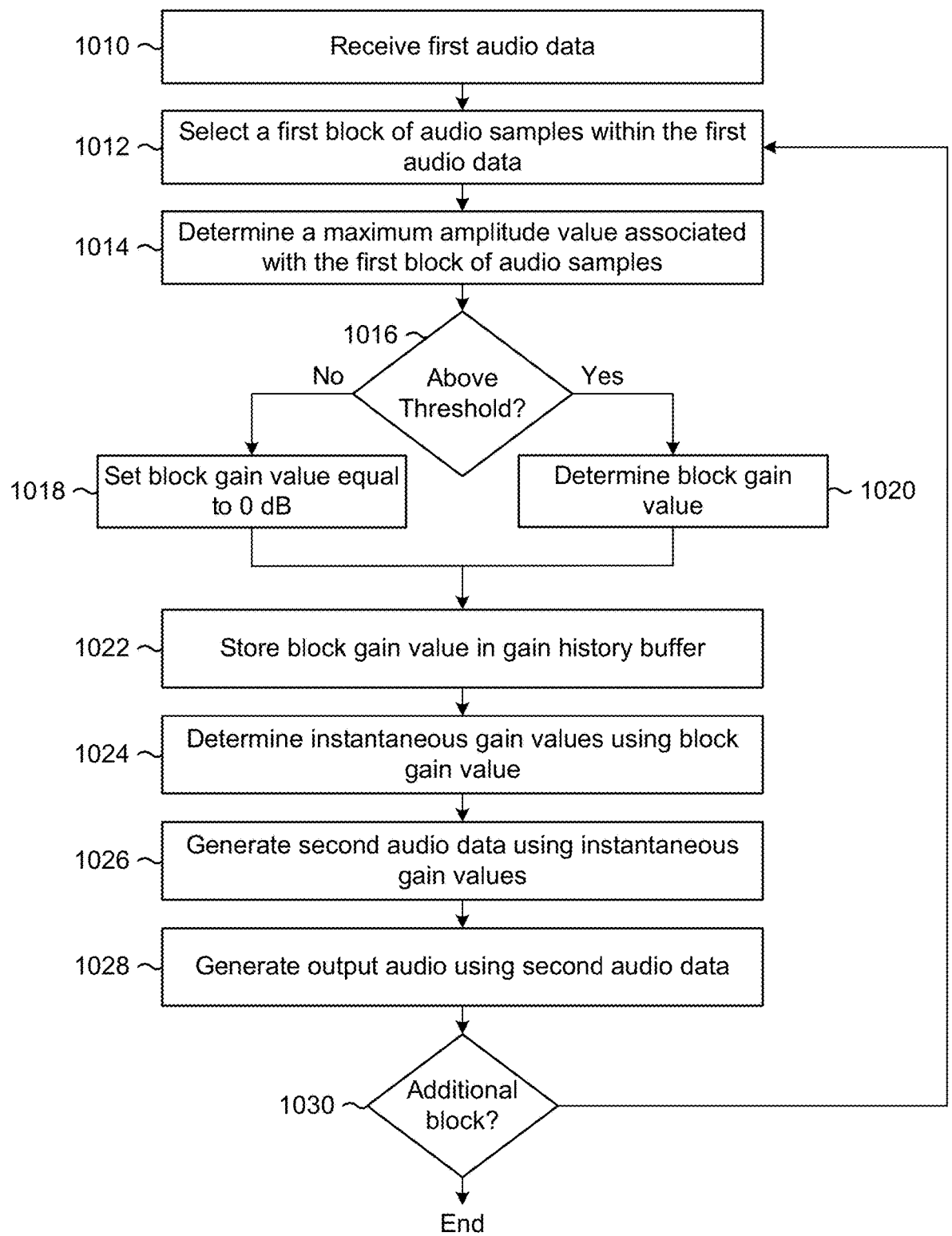
FIG. 10 is a flowchart conceptually illustrating an example method for performing block-based audio limiting according to embodiments of the present disclosure.

FIG. 10 is a flowchart conceptually illustrating an example method for performing block-based audio limiting according to embodiments of the present disclosure. As illustrated in FIG. 10, the device 110 may receive (1010) first audio data, may select (1012) a first block of audio samples (e.g., first audio frame) within the first audio data, and may determine (1014) a maximum amplitude value associated with the first block of audio samples. For example, as described above with regard to FIG. 3, the look-ahead peak detection component 320 may determine the maximum amplitude value within the first block of audio samples.

The device 110 may determine (1016) whether the maximum amplitude value is above a threshold value, and, if not, may set (1018) the block gain value equal to 0 dB (e.g., 1.0 using a linear scale). For example, the device 110 may continue generating output audio without attenuating the first audio data. However, if the maximum amplitude value is above the threshold value, the device 110 may determine (1020) a block gain value as described in greater detail above with regard to FIG. 3.

After determining the block gain value for the first block of audio samples, the device 110 may store (1022) the block gain value in a gain history buffer and may determine (1024) instantaneous gain values (e.g., per sample gain values for individual audio samples) using the block gain value. For example, the device 110 may determine an instantaneous gain value for individual audio samples within a portion of the first block of audio samples based on the block gain value.

The device 110 may generate (1026) second audio data using the instantaneous gain values and may generate (1028) output audio using the second audio data. For example, the device 110 may apply the instantaneous gain values to the first block of audio samples within the first audio data to generate a first block of audio samples within the second audio data. The device 110 may then determine (1030) whether there is an additional block of audio samples within the first audio data and, if so, may loop to step 1012 and repeat steps 1012-1028 for the additional block of audio samples.

Figure 11:
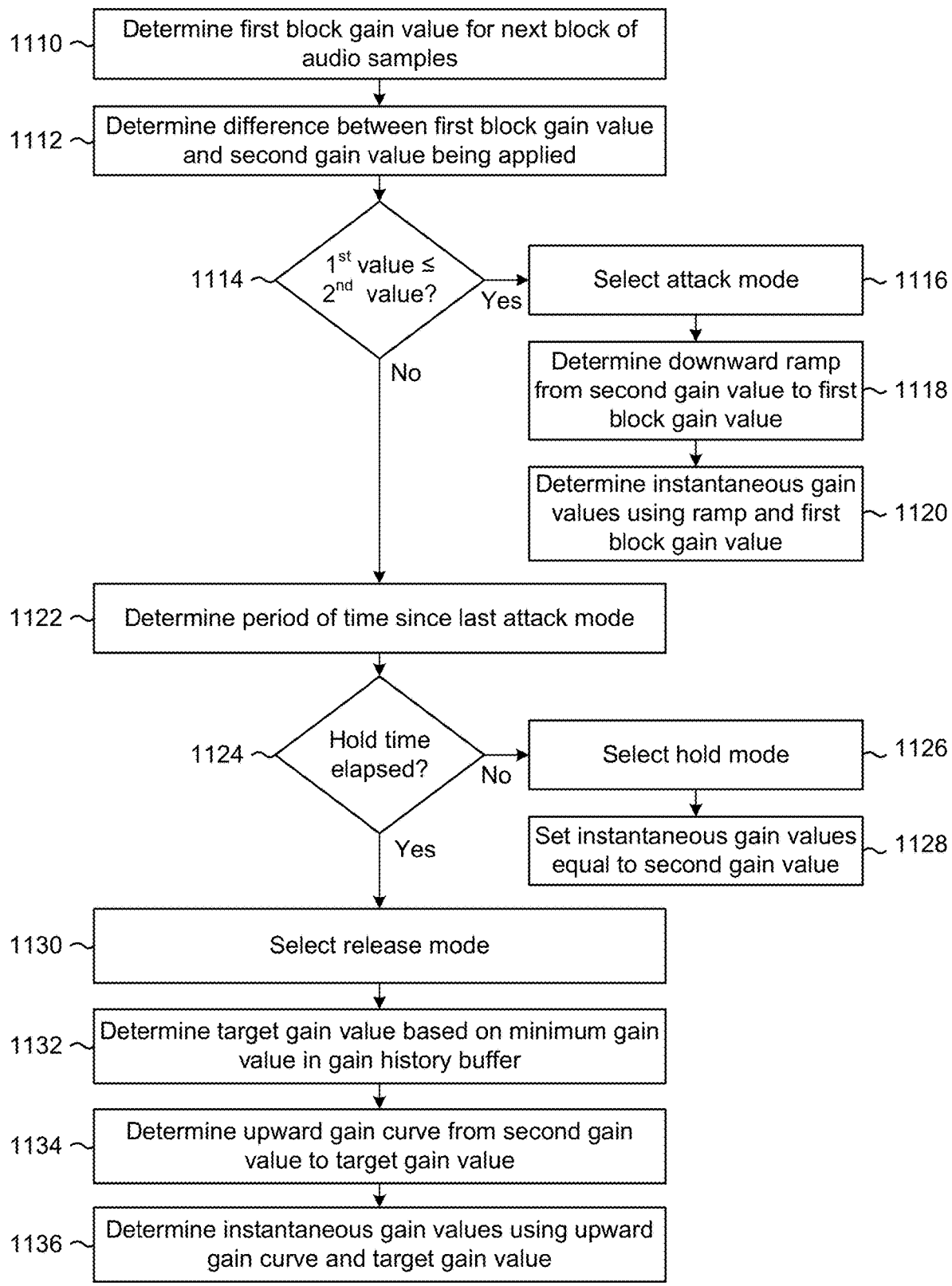
FIG. 11 is a flowchart conceptually illustrating an example method for determining instantaneous gain values according to embodiments of the present disclosure.

FIG. 11 is a flowchart conceptually illustrating an example method for determining instantaneous gain values according to embodiments of the present disclosure. As illustrated in FIG. 11, the device 110 may determine (1110) a first block gain value for the next block of audio samples and may determine (1112) a difference between the first block gain value and a second gain value being applied. The second gain value (e.g., transition gain value) corresponds to an instantaneous gain value (e.g., per sample gain value) for a final audio sample before the lookahead period of the current audio frame (e.g., prior to a beginning of the lookahead portion of the current audio frame). When the instantaneous gain values are relatively uniform prior to the lookahead period (e.g., during attack mode and hold mode), the second gain value may correspond to a current block gain value applied to the current audio frame. For example, if the block-by-block limiter component 300 associated the current audio frame with attack mode, the second gain value corresponds to a current block gain value associated with the current audio frame. Similarly, if the block-by-block limiter component 300 associated the current audio frame with the hold mode, the second gain value corresponds to the current block gain value associated with the most recent attack mode. In contrast, if the block-by-block limiter component 300 associated the current audio frame with release mode, the second gain value corresponds to an instantaneous gain value associated with the final audio sample before the lookahead period of the current audio frame. Thus, as the release mode releases the gain from a current block gain value to a target block gain value using a gain curve, the transition gain value is a discrete point between the current block gain value and the target block gain value along the gain curve.

The device 110 may determine (1114) whether the first block gain value is less than or equal to the second gain value. If the first block gain value is less than or equal to the second gain value, then the device 110 may select (1116) attack mode, determine (1118) a downward ramp from the second gain value to the first block gain value (e.g., linear ramp) and may determine (1120) instantaneous gain values (e.g., per sample gain values for individual audio samples) for the next block of audio samples using the ramp and the first block gain value.

If the first block gain is greater than the second gain value, the device 110 may determine (1122) a period of time since the last attack mode. For example, the device 110 may reset a hold counter every time the device 110 selects the attack mode, such that the hold counter indicates the period of time since the most recent attack mode. The device 110 may determine (1124) whether the hold time has elapsed and, if not, may select (1126) hold mode and set (1128) instantaneous values (e.g., per sample gain values for individual audio samples) for the next block of audio samples equal to the second gain value. In some examples, the device 110 may reset the hold counter to a hold time (e.g., 3, although the disclosure is not limited thereto) during an attack mode and decrement the hold counter for each audio frame processed during the hold mode, such that the device 110 determines that the hold time elapsed when the hold counter is equal to a value of zero. In other examples, the device 110 may reset the hold counter to zero during an attack mode and may increment the hold counter for each audio frame processed during the hold mode, such that the device 110 determines that the hold time elapsed when the hold counter is equal to the hold time value (e.g., 3). However, the disclosure is not limited thereto and the device 110 may determine that the hold time elapsed using other techniques without departing from the disclosure.

If the hold time has elapsed, the device 110 may select (1130) release mode, may determine (1132) a target gain value based on a minimum gain value in the gain history buffer, may determine (1134) an upward gain curve from the second gain value to the target gain value, and may determine (1136) instantaneous gain values (e.g., per sample gain values for individual audio samples) for the next block of audio samples using the upward gain curve and the target gain value. For example, the device 110 may release the gain to the target gain value using an asymptotic gain curve, although the disclosure is not limited thereto. Additionally or alternatively, the device 110 may determine the target gain value using gain minima tracking processing without departing from the disclosure, as described above with regard to FIG. 3.

Figure 12:
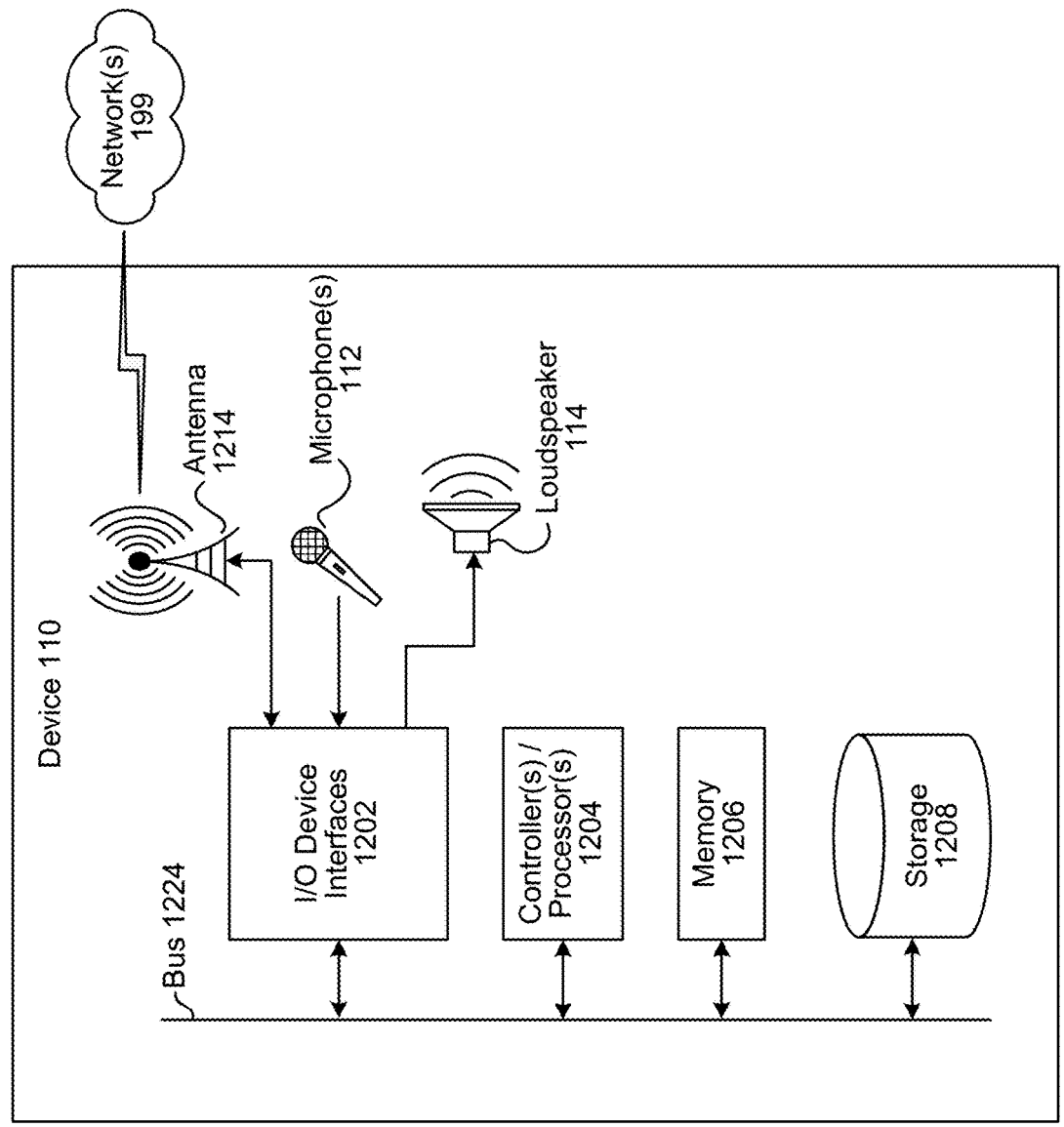
FIG. 12 is a block diagram conceptually illustrating example components of a device according to embodiments of the present disclosure.

FIG. 12 is a block diagram conceptually illustrating a device 110. FIG. 13 is a block diagram conceptually illustrating example components of a remote device, such as the media transport system 120. In operation, the system 100 may include computer-readable and computer-executable instructions that reside on the device 110 and/or the media transport system 120, as will be discussed further below. In addition, multiple devices 110 and/or multiple media transport systems 120 may be included in the system 100 of the present disclosure without departing from the disclosure.

The media transport system 120 may include one or more servers. A "server" as used herein may refer to a traditional server as understood in a server/client computing structure but may also refer to a number of different computing components that may assist with the operations discussed herein. For example, a server may include one or more physical computing components (such as a rack server) that are connected to other devices/components either physically and/or over a network and is capable of performing computing operations. A server may also include one or more virtual machines that emulates a computer system and is run on one or across multiple devices. A server may also include other combinations of hardware, software, firmware, or the like to perform operations discussed herein. The media transport system 120 may be configured to operate using one or more of a client-server model, a computer bureau model, grid computing techniques, fog computing techniques, mainframe techniques, utility computing techniques, a peer-to-peer model, sandbox techniques, or other computing techniques.

Each of these devices (110/120) may include one or more controllers/processors (1204/1304), which may each include a central processing unit (CPU) for processing data and computer-readable instructions, and a memory (1206/1306) for storing data and instructions of the respective device. The memories (1206/1306) may individually include volatile random access memory (RAM), non-volatile read only memory (ROM), non-volatile magnetoresistive memory (MRAM), and/or other types of memory. Each device (110/120) may also include a data storage component (1208/1308) for storing data and controller/processor-executable instructions. Each data storage component (1208/1308) may individually include one or more non-volatile storage types such as magnetic storage, optical storage, solid-state storage, etc. Each device (110/120) may also be connected to removable or external non-volatile memory and/or storage (such as a removable memory card, memory key drive, networked storage, etc.) through respective input/output device interfaces (1202/1302).

Each device (110/120) may include components that may comprise processor-executable instructions stored in storage (1208/1308) to be executed by controller(s)/processor(s) (1204/1304) (e.g., software, firmware, hardware, or some combination thereof). For example, components of the device (110/120) may be part of a software application running in the foreground and/or background on the device (110/120). Some or all of the controllers/components of the device (110/120) may be executable instructions that may be embedded in hardware or firmware in addition to, or instead of, software. In one embodiment, the device (110/120) may operate using an Android operating system (such as Android 4.3 Jelly Bean, Android 4.4 KitKat or the like), an Amazon operating system (such as FireOS or the like), or any other suitable operating system.

Computer instructions for operating each device (110/120) and its various components may be executed by the respective device's controller(s)/processor(s) (1204/1304), using the memory (1206/1306) as temporary "working" storage at runtime. A device's computer instructions may be stored in a non-transitory manner in non-volatile memory (1206/1306), storage (1208/1308), or an external device(s). Alternatively, some or all of the executable instructions may be embedded in hardware or firmware on the respective device in addition to or instead of software.

Each device (110/120) includes input/output device interfaces (1202/1302). A variety of components may be connected through the input/output device interfaces (1202/1302), as will be discussed further below. Additionally, each device (110/120) may include an address/data bus (1224/1324) for conveying data among components of the respective device. Each component within a device (110/120) may also be directly connected to other components in addition to (or instead of) being connected to other components across the bus (1224/1324).

Referring to FIG. 12, the device 110 may include input/output device interfaces 1202 that connect to a variety of components such as an audio output component such as a loudspeaker 114, a wired headset or a wireless headset (not illustrated), or other component capable of outputting audio (e.g., producing sound). The audio output component may be integrated into a single device or may be separate. The device 110 may also include one or more audio capture component(s). For example, the device 110 may include one or more microphone(s) 112 (e.g., a plurality of microphone(s) in a microphone array), a wired headset or a wireless headset (not illustrated), and/or the like. The audio capture component(s) may be integrated into a single device or may be separate. If an array of microphones is included, approximate distance to a sound's point of origin may be determined by acoustic localization based on time and amplitude differences between sounds captured by different microphones of the array. The device 110 may additionally include a display (not illustrated) for displaying content and/or may further include a camera (not illustrated), although the disclosure is not limited thereto. In some examples, the microphone(s) 112 and/or loudspeaker(s) 114 may be external to the device 110, although the disclosure is not limited thereto. The input/output interfaces 1202 may include A/D converters (not illustrated) and/or D/A converters (not illustrated) without departing from the disclosure.

The input/output device interfaces 1202 may also include an interface for an external peripheral device connection such as universal serial bus (USB), FireWire, Thunderbolt, Ethernet port or other connection protocol that may connect to network(s) 199.

The input/output device interfaces (1202/1302) may be configured to operate with network(s) 199. For example, via antenna(s) 1214, the input/output device interfaces 1202 may connect to one or more networks 199 via a wireless local area network (WLAN) (such as Wi-Fi) radio, Bluetooth, and/or wireless network radio, such as a radio capable of communication with a wireless communication network such as a Long Term Evolution (LTE) network, WiMAX network, 3G network, 4G network, 5G network, etc. A wired connection such as Ethernet may also be supported. Thus, the devices (110/120) may be connected to the network(s) 199 through either wired or wireless connections.

The network(s) 199 may include a local or private network or may include a wide network (e.g., wide area network (WAN)), such as the internet. Through the network(s) 199, the system may be distributed across a networked environment. The I/O device interface (1202/1302) may also include communication components that allow data to be exchanged between devices such as different physical servers in a collection of servers or other components.

The components of the device 110 and/or the media transport system 120 may include their own dedicated processors, memory, and/or storage. Alternatively, one or more of the components of the device 110 and/or the media transport system 120 may utilize the I/O interfaces (1202/1302), processor(s) (1204/1304), memory (1206/1306), and/or storage (1208/1308) of the device(s) 110 and/or the media transport system 120.

As noted above, multiple devices may be employed in a single system. In such a multi-device system, each of the devices may include different components for performing different aspects of the system's processing. The multiple devices may include overlapping components. The components of the device 110 and the system 120 as described herein, are illustrative, and may be located as a stand-alone device or may be included, in whole or in part, as a component of a larger device or system.

As illustrated in FIG. 14, multiple devices (110a-110g and 120) may contain components of the system and the devices may be connected over a network(s) 199. The network(s) 199 may include a local or private network or may include a wide network such as the Internet. Devices may be connected to the network(s) 199 through either wired or wireless connections. For example, a tablet computer 110a, a smart phone 110b, a smart watch 110c, speech-detection device(s) with a display 110d, speech-detection device(s) 110e, headless device(s) 110f, and/or a smart television 110g may be connected to the network(s) 199 through a wired and/or wireless connection. For example, the devices 110 may be connected to the network(s) 199 via an Ethernet port, a wireless service provider, over a Wi-Fi or cellular network connection, and/or the like.

The concepts disclosed herein may be applied within a number of different devices and computer systems, including, for example, general-purpose computing systems, speech processing systems, server-client computing systems, mainframe computing systems, telephone computing systems, laptop computers, cellular phones, personal digital assistants (PDAs), tablet computers, video capturing devices, wearable computing devices (watches, glasses, etc.), other mobile devices, video game consoles, speech processing systems, distributed computing environments, etc. Thus the components, components and/or processes described above may be combined or rearranged without departing from the present disclosure. The functionality of any component described above may be allocated among multiple components, or combined with a different component. As discussed above, any or all of the components may be embodied in one or more general-purpose microprocessors, or in one or more special-purpose digital signal processors or other dedicated microprocessing hardware. One or more components may also be embodied in software implemented by a processing unit. Further, one or more of the components may be omitted from the processes entirely.

The above aspects of the present disclosure are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of computers and speech processing should recognize that components and process steps described herein may be interchangeable with other components or steps, or combinations of components or steps, and still achieve the benefits and advantages of the present disclosure. Moreover, it should be apparent to one skilled in the art, that the disclosure may be practiced without some or all of the specific details and steps disclosed herein.

Aspects of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage medium may be implemented by a volatile computer memory, non-volatile computer memory, hard drive, solid-state memory, flash drive, removable disk, and/or other media.

Embodiments of the present disclosure may be performed in different forms of software, firmware, and/or hardware. For example, an acoustic front end (AFE), may comprise, among other things, analog and/or digital filters (e.g., filters configured as firmware to a digital signal processor (DSP)). Further, the teachings of the disclosure may be performed by an application specific integrated circuit (ASIC), field programmable gate array (FPGA), or other component, for example.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements, and/or steps are in any way required for one or more embodiments or that one or more embodiments necessarily include logic for deciding, with or without other input or prompting, whether these features, elements, and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, Z," unless specifically stated otherwise, is understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

As used in this disclosure, the term "a" or "one" may include one or more items unless specifically stated otherwise. Further, the phrase "based on" is intended to mean "based at least in part on" unless specifically stated otherwise.

What is claimed is:

1. A computer-implemented method, the method comprising:
   receiving first audio data;
   determining a first maximum amplitude value associated with a first plurality of audio samples within the first audio data, the first plurality of audio samples corresponding to a first time window;
   determining that the first maximum amplitude value exceeds a threshold value;
   determining a first gain value based on the threshold value and the first maximum amplitude value;
   determining a first plurality of gain values using the first gain value; and
   generating second audio data using the first plurality of gain values and the first plurality of audio samples.

2. The computer-implemented method of claim 1, further comprising:
   determining a second maximum amplitude value associated with a second plurality of audio samples within the first audio data, the second plurality of audio samples following the first plurality of audio samples and corresponding to the first time window;
   determining that the second maximum amplitude value exceeds the threshold value;

determining a second gain value based on the threshold value and the second maximum amplitude value, the second gain value different from the first gain value; and determining a second plurality of gain values using the second gain value, wherein generating the second audio data further comprises:

generating a first portion of the second audio data using the first plurality of gain values and the first plurality of audio samples, and generating a second portion of the second audio data using the second plurality of gain values and the second plurality of audio samples.

3. The computer-implemented method of claim 1, wherein determining the first maximum amplitude value further comprises:

determining a first amplitude value that is a highest value of first audio samples of the first plurality of audio samples, the first audio samples corresponding to a first loudspeaker;

determining a second amplitude value that is a highest value of second audio samples of the first plurality of audio samples, the second audio samples corresponding to a second loudspeaker;

determining that the first amplitude value exceeds the second amplitude value; and determining that the first amplitude value corresponds to the first maximum amplitude value for the first plurality of audio samples.

4. The computer-implemented method of claim 1, further comprising:

determining a second gain value associated with a second plurality of audio samples within the first audio data, the second plurality of audio samples preceding the first plurality of audio samples and corresponding to the first time window;

determining that the first gain value is less than the second gain value;

determining a first series of gain values included in the first plurality of gain values, the first series of gain values beginning at the second gain value and decreasing to the first gain value;

determining a second series of gain values included in the first plurality of gain values, the second series of gain values equal to the first gain value;

generating a first portion of the second audio data using the first series of gain values and first audio samples of the first plurality of audio samples; and generating a second portion of the second audio data using the second series of gain values and second audio samples of the first plurality of audio samples.

5. The computer-implemented method of claim 4, wherein generating the first portion of the second audio data further comprises:

generating a first audio sample of the second audio data by applying the second gain value to a first audio sample of the first audio samples;

generating a second audio sample of the second audio data by applying a third gain value to a second audio sample of the first audio samples, the third gain value being less than the second gain value and greater than the first gain value; and generating a third audio sample of the second audio data by applying the first gain value to a third audio sample of the first audio samples.

6. The computer-implemented method of claim 1, further comprising:

determining a second gain value associated with a second plurality of audio samples within the first audio data, the second plurality of audio samples preceding the first plurality of audio samples and corresponding to the first time window;

determining that the first gain value exceeds the second gain value;

determining the first plurality of gain values, the first plurality of gain values beginning at the second gain value and increasing to the first gain value; and generating the second audio data using the first plurality of gain values and the first plurality of audio samples.

7. The computer-implemented method of claim 1, further comprising:

determining a second gain value associated with a second plurality of audio samples within the first audio data, the second plurality of audio samples preceding the first plurality of audio samples and corresponding to the first time window;

determining that the first gain value exceeds the second gain value;

determining a first number of gain values applied to the first audio data;

determining a minimum gain value of the first number of gain values;

determining the first plurality of gain values, the first plurality of gain values beginning at the second gain value and increasing to the minimum gain value; and generating a first portion of the second audio data using the first plurality of gain values and the first plurality of audio samples.

8. The computer-implemented method of claim 7, further comprising:

determining a third gain value associated with a third plurality of audio samples within the first audio data, the third plurality of audio samples following the first plurality of audio samples and corresponding to the first time window;

determining that the third gain value is less than the minimum gain value;

determining a second plurality of gain values beginning at the minimum gain value and decreasing to the third gain value;

determining a third plurality of gain values equal to the third gain value;

generating a second portion of the second audio data using the second plurality of gain values and first audio samples of the third plurality of audio samples; and generating a third portion of the second audio data using the third plurality of gain values and second audio samples of the third plurality of audio samples.

9. The computer-implemented method of claim 1, further comprising:

determining a second maximum amplitude value associated with a second plurality of audio samples within the first audio data, the second plurality of audio samples following the first plurality of audio samples and corresponding to the first time window;

determining that the second maximum amplitude value is less than the threshold value;

setting a second gain value associated with the second plurality of audio samples equal to a value of one; and generating a second portion of the second audio data using the second gain value and the second plurality of audio samples.

10. The computer-implemented method of claim 1, further comprising:
- determining a second maximum amplitude value associated with a second plurality of audio samples within the first audio data, the second plurality of audio samples following the first plurality of audio samples and corresponding to the first time window;
- determining that the second maximum amplitude value is less than the threshold value;
- determining a second gain value based on the threshold value and the second maximum amplitude value;
- determining a second plurality of gain values using the second gain value; and
- generating a second portion of the second audio data using the second plurality of gain values and the second plurality of audio samples.

11. The computer-implemented method of claim 1, wherein the first plurality of audio samples are associated with a first time range and a first frequency range, and the method further comprises:
- determining a second maximum amplitude value associated with a second plurality of audio samples within the first audio data, the second plurality of audio samples associated with the first time range and a second frequency range different from the first frequency range;
- determining that the second maximum amplitude value exceeds the threshold value;
- determining a second gain value based on the threshold value and the second maximum amplitude value;
- determining a second plurality of gain values using the second gain value;
- generating a first portion of the second audio data using the first plurality of gain values and the first plurality of audio samples; and
- generating a second portion of the second audio data using the second plurality of gain values and the second plurality of audio samples.

12. A system comprising:
- at least one processor; and
- memory including instructions operable to be executed by the at least one processor to cause the system to:
  - receive first audio data;
  - determine a first maximum amplitude value associated with a first plurality of audio samples within the first audio data, the first plurality of audio samples corresponding to a first time window;
  - determine that the first maximum amplitude value exceeds a threshold value;
  - determine a first gain value based on the threshold value and the first maximum amplitude value;
  - determining a first plurality of gain values using the first gain value; and
  - generate second audio data using the first plurality of gain values and the first plurality of audio samples.

13. The system of claim 12, wherein the memory further comprises instructions that, when executed by the at least one processor, further cause the system to:
- generate a first portion of the second audio data using the first plurality of gain values and the first plurality of audio samples;
- determine a second maximum amplitude value associated with a second plurality of audio samples within the first audio data, the second plurality of audio samples following the first plurality of audio samples and corresponding to the first time window;
- determine that the second maximum amplitude value exceeds the threshold value;
- determine a second gain value based on the threshold value and the second maximum amplitude value, the second gain value different from the first gain value;
- determine a second plurality of gain values using the second gain value; and
- generate a second portion of the second audio data using the second plurality of gain values and the second plurality of audio samples.

14. The system of claim 12, wherein the memory further comprises instructions that, when executed by the at least one processor, further cause the system to:
- determine a first amplitude value that is a highest value of first audio samples of the first plurality of audio samples, the first audio samples corresponding to a first loudspeaker;
- determine a second amplitude value that is a highest value of second audio samples of the first plurality of audio samples, the second audio samples corresponding to a second loudspeaker;
- determine that the first amplitude value exceeds the second amplitude value; and
- determine that the first amplitude value corresponds to the first maximum amplitude value for the first plurality of audio samples.

15. The system of claim 12, wherein the memory further comprises instructions that, when executed by the at least one processor, further cause the system to:
- determine a second gain value associated with a second plurality of audio samples within the first audio data, the second plurality of audio samples preceding the first plurality of audio samples and corresponding to the first time window;
- determine that the first gain value is less than the second gain value;
- determine a first series of gain values included in the first plurality of gain values, the first series of gain values beginning at the second gain value and decreasing to the first gain value;
- determine a second series of gain values included in the first plurality of gain values, the second series of gain values equal to the first gain value;
- generate a first portion of the second audio data using the first series of gain values and first audio samples of the first plurality of audio samples; and
- generate a second portion of the second audio data using the second series of gain values and second audio samples of the first plurality of audio samples.

16. The system of claim 15, wherein the memory further comprises instructions that, when executed by the at least one processor, further cause the system to:
- generate a first audio sample of the second audio data by applying the second gain value to a first audio sample of the first audio samples;
- generate a second audio sample of the second audio data by applying a third gain value to a second audio sample of the first audio samples, the third gain value being less than the second gain value and greater than the first gain value; and
- generate a third audio sample of the second audio data by applying the first gain value to a third audio sample of the first audio samples.

17. The system of claim 12, wherein the memory further comprises instructions that, when executed by the at least one processor, further cause the system to:

determine a second gain value associated with a second plurality of audio samples within the first audio data, the second plurality of audio samples preceding the first plurality of audio samples and corresponding to the first time window;

determine that the first gain value exceeds the second gain value;

determine the first plurality of gain values, the first plurality of gain values beginning at the second gain value and increasing to the first gain value; and generate the second audio data using the first plurality of gain values and the first plurality of audio samples.

18. The system of claim 12, wherein the memory further comprises instructions that, when executed by the at least one processor, further cause the system to:

determine a second gain value associated with a second plurality of audio samples within the first audio data, the second plurality of audio samples preceding the first plurality of audio samples and corresponding to the first time window;

determine that the first gain value exceeds the second gain value;

determine a first number of gain values applied to the first audio data;

determine a minimum gain value of the first number of gain values;

determine the first plurality of gain values, the first plurality of gain values beginning at the second gain value and increasing to the minimum gain value; and generate a first portion of the second audio data using the first plurality of gain values and the first plurality of audio samples.

19. The system of claim 12, wherein the memory further comprises instructions that, when executed by the at least one processor, further cause the system to:

determine a second maximum amplitude value associated with a second plurality of audio samples within the first audio data, the second plurality of audio samples following the first plurality of audio samples and corresponding to the first time window;

determine that the second maximum amplitude value is less than the threshold value;

determine a gain value based on the threshold value and the second maximum amplitude value, the gain value associated with the second plurality of audio samples; and generate a second portion of the second audio data using the gain value and the second plurality of audio samples.

20. The system of claim 12, wherein the first plurality of audio samples are associated with a first time range and a first frequency range, and the memory further comprises instructions that, when executed by the at least one processor, further cause the system to:

determine a second maximum amplitude value associated with a second plurality of audio samples within the first audio data, the second plurality of audio samples associated with the first time range and a second frequency range different from the first frequency range;

determine that the second maximum amplitude value exceeds the threshold value;

determine a second gain value based on the threshold value and the second maximum amplitude value;

determine a second plurality of gain values using the second gain value;

generate a first portion of the second audio data using the first plurality of gain values and the first plurality of audio samples; and generate a second portion of the second audio data using the second plurality of gain values and the second plurality of audio samples.

\* \* \* \* \*